United States Patent
Oikawa

(10) Patent No.: US 10,403,569 B2
(45) Date of Patent: Sep. 3, 2019

(54) SEMICONDUCTOR DEVICE

(71) Applicant: Renesas Electronics Corporation, Tokyo (JP)

(72) Inventor: Ryuichi Oikawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/976,388

(22) Filed: May 10, 2018

(65) Prior Publication Data

US 2018/0374787 A1 Dec. 27, 2018

(30) Foreign Application Priority Data

Jun. 26, 2017 (JP) ................................ 2017-124553

(51) Int. Cl.
*H01L 23/495* (2006.01)
*H01L 23/498* (2006.01)
*H01L 23/66* (2006.01)

(52) U.S. Cl.
CPC .. *H01L 23/49827* (2013.01); *H01L 23/49816* (2013.01); *H01L 23/49822* (2013.01); *H01L 23/66* (2013.01); *H01L 2224/16225* (2013.01); *H01L 2924/15311* (2013.01)

(58) Field of Classification Search
CPC ......... H01L 23/49827; H01L 23/49838; H01L 23/49822; H01L 23/66
USPC ........................................ 257/691–692, 698
See application file for complete search history.

(56) References Cited

U.S. PATENT DOCUMENTS

| | | | | |
|---|---|---|---|---|
| 5,418,691 A * | 5/1995 | Tokura | ................... | H01R 12/62 |
| | | | | 174/254 |
| 5,477,082 A * | 12/1995 | Buckley, III | ........ | H01L 23/5384 |
| | | | | 257/679 |
| 6,812,411 B2 * | 11/2004 | Belau | ................... | H01R 12/526 |
| | | | | 174/261 |
| 7,525,816 B2 * | 4/2009 | Sawachi | .............. | H05K 1/0212 |
| | | | | 174/250 |
| 7,688,594 B2 * | 3/2010 | Muto | ................... | H05K 1/0219 |
| | | | | 174/254 |
| 9,330,992 B2 | 5/2016 | Nakagawa | | |
| 2001/0054512 A1* | 12/2001 | Belau | ................... | H01R 12/526 |
| | | | | 174/262 |
| 2003/0178403 A1* | 9/2003 | Lemmerhirt | ............ | B81C 3/008 |
| | | | | 219/209 |
| 2006/0281343 A1* | 12/2006 | Uchida | ................... | H05K 3/363 |
| | | | | 439/67 |
| 2007/0102830 A1* | 5/2007 | Muto | ................... | H05K 1/0219 |
| | | | | 257/784 |
| 2010/0175251 A1* | 7/2010 | Muto | ................... | H05K 1/0219 |
| | | | | 29/846 |

FOREIGN PATENT DOCUMENTS

JP 2014-175356 A 9/2014

* cited by examiner

*Primary Examiner* — Nitin Parekh
(74) *Attorney, Agent, or Firm* — McDermott Will & Emery LLP

(57) ABSTRACT

To improve signal transmission characteristics of a high frequency signal of 80 GHz or higher. A semiconductor device includes a wiring board having a structure in which a signal via structure and a grounding via structure have mutually overlapping portions in plan view.

11 Claims, 34 Drawing Sheets

POTENTIAL IN GROUNDING THROUGH VIA → FLUCTUATION

FIG. 10

| | LOW FREQUENCY SIGNAL | HIGH FREQUENCY SIGNAL |
|---|---|---|
| CONVENTIONAL SIGNAL TRANSMISSION | SIGNAL TRANSMISSION IN THICKNESS DIRECTION | LEAKAGE ELECTROMAGNETIC WAVE IS GENERATED IN HORIZONTAL DIRECTION (REFER TO FIG. 7) → NO SIGNAL IS TRANSMITTED IN THICKNESS DIRECTION |
| SIGNAL TRANSMISSION IN THE PRESENT EMBODIMENT | SIGNAL TRANSMISSION IN THICKNESS DIRECTION | SIGNAL TRANSMISSION IN HORIZONTAL DIRECTION |

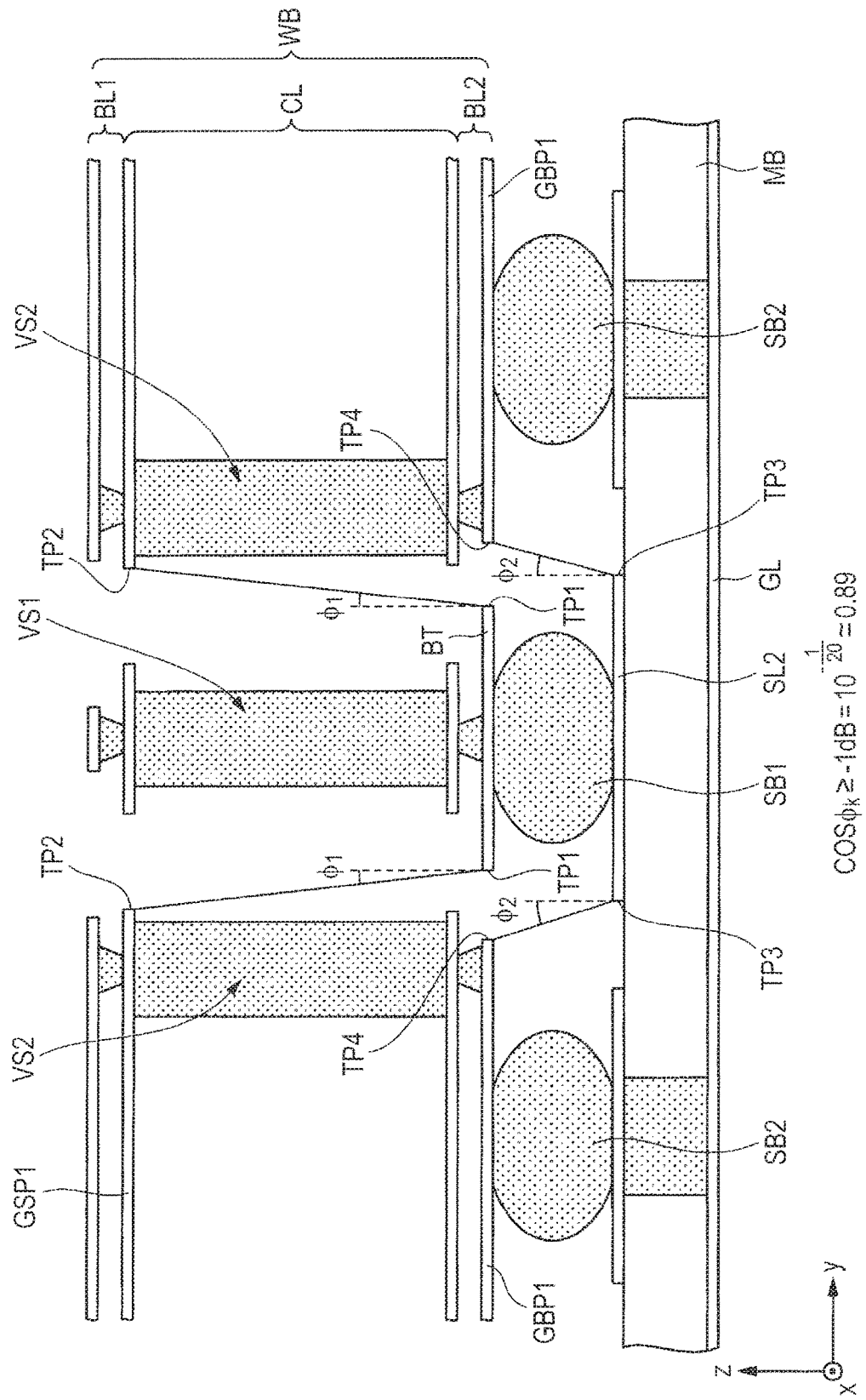

SEMICONDUCTOR DEVICE

CROSS-REFERENCE TO RELATED APPLICATIONS

The disclosure of Japanese Patent Application No. 2017-124553 filed on Jun. 26, 2017 including the specification, drawings and abstract is incorporated herein by reference in its entirety.

BACKGROUND

The present invention relates to a semiconductor device, and to a technology effective for application to a semiconductor device having a function of performing the transmission/reception of a high frequency signal of 80 GHz or higher, for example.

There has been described in Japanese Unexamined Patent Publication Laid-Open No. 2014-175356 (Patent Document 1), a technology which improves a signal transmission band in a through via formed in a wiring board.

RELATED ART DOCUMENTS

Patent Document

[Patent Document 1] Japanese Unexamined Patent Publication Laid-Open No. 2014-175356

SUMMARY

For example, it has been necessary for a millimeter wave radar system for automatic driving to develop a semiconductor device which realizes the transmission/reception of a high frequency signal exceeding 80 GHz. According to examinations by the present inventors, however, it has been newly clarified that when a wiring board adopted in the related art semiconductor device is used upon realizing the transmission/reception of a high frequency signal exceeding 80 GHz, signal transmission characteristics in the direction of thickness of the wiring board are not sufficient. It has therefore been desired to realize a semiconductor device having a structure capable of transmitting the high frequency signal exceeding 80 GHz with less loss.

Other objects and novel features of the present invention will become apparent from the description of the present specification and the accompanying drawings.

A semiconductor device according to one aspect of the present invention includes a wiring board having a structure in which a signal via structure and a grounding via structure have mutually overlapping portions in plan view.

In a semiconductor device according to one aspect of the present invention, it is possible to improve signal transmission characteristics of a high frequency signal of 80 GHz or higher.

BRIEF DESCRIPTION OF THE DRAWINGS

FIG. 10 is a diagram showing a related art signal transmission method and a signal transmission method in the embodiment 1 by comparison;

FIG. 11 is a diagram typically showing a configuration example of realizing a "horizontal transmission mode" in a modification;

DETAILED DESCRIPTION

Figure 1:
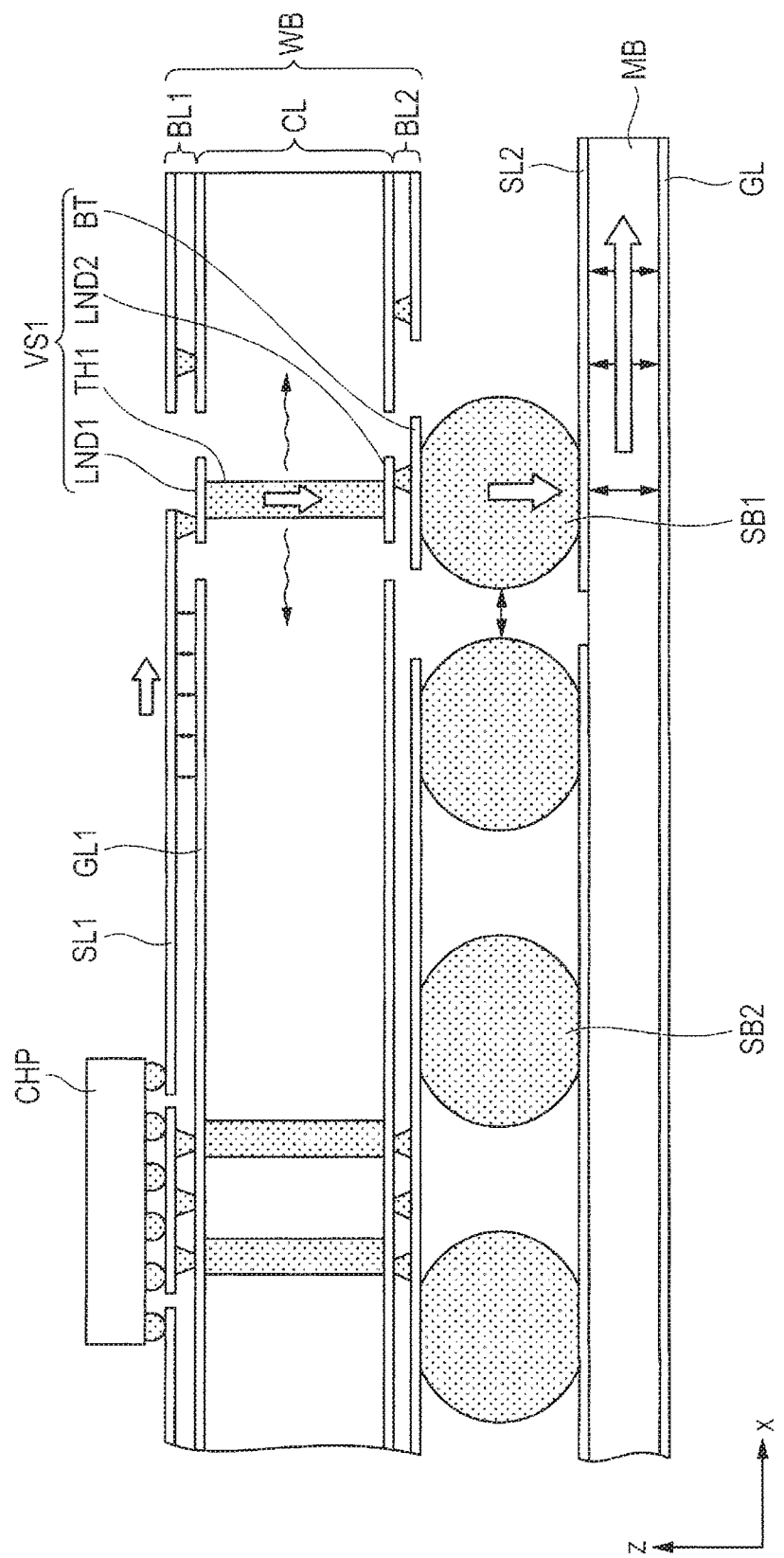
FIG. 1 is a diagram for describing a mechanism in which signal transmission characteristics are degraded.

The invention will be described by being divided into a plurality of sections or embodiments whenever circumstances require it for convenience in the following embodiments. However, unless otherwise specified in particular, they are not irrelevant to one another. One thereof has to do with modifications, details, supplementary explanations, etc. of some or all of the other.

Also, when reference is made to the number of elements or the like (including the number of pieces, numerical values, quantity, range, etc.) in the following embodiments, the number thereof is not limited to a specific number and may be greater than or less than or equal to the specific number except for where otherwise specified in particular and definitely limited to the specific number in principle, etc.

It is further needless to say that in the following embodiments, components (also including element steps, etc.) employed therein are not always essential except for where otherwise specified in particular and considered to be definitely essential in principle, etc.

Similarly, when reference is made to the shapes, positional relations and the like of components or the like in the following embodiments, they will include ones substantially analogous or similar to their shapes or the like except for where otherwise specified in particular and considered not to be definitely so in principle, etc. This is similarly applied even to the above-described numerical values and range.

The same reference numerals are respectively attached to the same members in principle in all the drawings for describing the embodiments, and their repetitive description will be omitted. Incidentally, even plan diagrams may be hatched for clarity of illustration.

Embodiment 1

<Considerations for Improvements>

For example, in a semiconductor device which realizes the transmission/reception of a high frequency signal exceeding 80 GHz, it is made evident that when a wiring board adopted in the related art semiconductor device is used, signal transmission characteristics in the direction of thickness of the wiring board become insufficient. For example, the wiring board is comprised of a multi-layer board formed with build-up layers so as to interpose a core layer therebetween. The thickness of the core layer is normally 400 µm or so in spite of being thin. That is, when the wiring board having the core layer whose thickness is 400 µm or so is applied to the semiconductor device realizing the transmission/reception of the high frequency signal exceeding 80 GHz, degradation in the signal transmission characteristics in the thickness direction of the wiring board is actualized.

A direct solution related to this point resides in that the thickness of the wiring board is made thin. However, when the thickness of the wiring board is made thin, the mechanical strength of the wiring board is degraded. That is, when the thickness of the wiring board is made thin to improve the signal transmission characteristics of the high frequency signal exceeding 80 GHz, inconvenience to be shown below is actualized in return for the improvement in the signal transmission characteristics. That is, the thinning of the wiring board will incur the inconvenience that (1) the packaging itself of the semiconductor device and handling thereof after its packaging are difficult, (2) strain is easy to be stored in the wiring board, and the long-term reliability of the semiconductor device is difficult to be ensured, and (3) it is difficult to perform pin multiplication and upsizing of the semiconductor device necessary for its multifunctioning.

Therefore, the present inventors have examined, to return to the basis of a physical phenomenon, why the wiring board having the conventional thickness which is sufficient in mechanical strength and easy to be handled will incur degradation in the signal transmission characteristics of a high frequency signal in a millimeter-wave band (frequency band exceeding 80 GHz). As a result, the present inventors have newly found that the adoption of a new signal transmission method based on a technical idea different from the conventional common sense makes it possible to transmit the high frequency signal in the millimeter-wave band with less loss even while using the wiring board having the thickness used up to now. In an embodiment 1 to be described below, the process of leading to the technical idea different from, the conventional common sense will be described, and thereafter the technical idea will be described. Further, in embodiments subsequent to an embodiment 2, specific package structures of a semiconductor device which embodies the present technical idea will be described.

<<Measure for Improvement in Signal Transmission Characteristics by Reduction in Parasitic Capacity>>

For example, a wiring board has been used to realize the transfer of signals between an internal circuit formed in a semiconductor chip and a device outside the semiconductor device. Specifically, a semiconductor device is mounted at the surface of a wiring board, and a wiring and the semiconductor chip formed at the surface of the wiring board are coupled to each other. Then, the wiring board is formed with through holes penetrating therethrough in a thickness direction thereof. The wiring formed at the surface of the wiring board and a wiring formed at the back surface of the wiring board can be electrically coupled via the through holes. Further, external coupling terminals typified by solder balls are formed at the back surface of the wiring board. The wiring formed at the back surface of the wiring board is electrically coupled to its corresponding external coupling terminal. The semiconductor device configured in this manner is electrically coupled to other electronic parts mounted onto a mounting board called a mother board by the external coupling terminals formed at the back surface of the wiring board. That is, the internal circuit formed in the semiconductor chip is capable of realizing the transfer of signals from and to the external device by a path of the wiring formed at the surface of the wiring board, the through hole penetrating the wiring board, the wiring formed at the back surface of the wiring board, the external coupling terminals, and the mounting board.

Here, the wiring formed at the surface of the wiring board is comprised of, for example, a strip line. Then, since the strip line has a uniform sectional structure and a uniform characteristic impedance distribution, it has a high signal transmission band. That is, since the strip line configuring the wiring is small in terms of the dependency of the characteristic impedance on the frequency, the uniform characteristic impedance can be realized over a wide signal frequency band. This means that the wiring formed at the surface of the wiring board becomes easy to make impedance matching over the wide frequency band. Similarly, since the wiring formed over the mounting board is also comprised of a strip line or a microstrip line, the uniform characteristic impedance can be realized over a wide signal frequency band, so that it becomes easy to make impedance matching over the wide frequency band.

On the other hand, as described above, the wiring formed at the surface of the wiring board, and the wiring formed over the mounting board are coupled via the through hole penetrating the wiring board and the external coupling terminal (solder ball) mounted onto the back surface of the wiring board. At this time, the through hole and the external coupling terminal are discontinuous structural bodies different in characteristic impedance and sectional structure even with respect to both of the wiring formed at the surface of the wiring board and the wiring formed over the mounting board. Thus, the whole signal transmission band in the transmission path from the semiconductor chip to the mounting board is limited by the signal transmission band for the through hole and the external coupling terminal each being the discontinuous structural body. That is, in order to suppress reflection of a signal in the discontinuous structural body, there is a need to match the characteristic impedance at the through hole and the external coupling terminal each being the discontinuous structural body with the characteristic impedance of each wiring. However, the lands are formed at the upper and lower ends of each through hole, and the external coupling terminal is also formed to adhere to its corresponding land formed at the back surface of the wiring board. Further, the land has a portion where it partly overlaps with the ground pattern formed in the wiring board. As a result, a parasitic capacity is generated due to the planar overlapping of the through hole and the ground pattern. That is, even if the characteristic impedance at each of the through hole and the external coupling terminal each being the discontinuous structural body is designed to match with the characteristic impedance of the wiring, the characteristic impedance is deviated due to the parasitic capacity. That is, since the characteristic impedance is represented in $\sqrt{(L/C)}$ when the resistance is ignored, "C" changes when the parasitic capacitance exists, so that the characteristic impedance represented in $\sqrt{(L/C)}$ is inevitably changed.

Thus, there is considered, for example, a measure for designing the layout of the ground pattern so as not to planarly overlap with the land by paying attention to the fact that the deviation of the characteristic impedance can be suppressed where it is possible to reduce the parasitic capacity. According to the present measure, the deviation between the characteristic impedance of each of the through hole and the external coupling terminal each being the discontinuous structural body and the characteristic impedance of the wiring is suppressed. Thus, it is possible to ensure the impedance matching over the wide signal frequency band. In other words, it is possible to attain an improvement in signal transmission characteristics by ensuring the impedance matching even with respect to a signal having a high frequency. This measure is an idea that the parasitic capacity is reduced to suppress the impedance mismatching at the discontinuous structural body and thereby improve the signal transmission characteristics even with respect to the high frequency signal. As a result of examinations of this matter by the present inventors, however, the present inventors have found that only the measure to pay attention to the above impedance matching is not sufficient in order to improve signal transmission characteristics of a signal having a higher frequency. Therefore, a further measure for improving the signal transmission characteristics of the high frequency signal will be described.

<<Reasons why Only the Measure for Reducing the Parasitic Capacity is Insufficient>>

As described above, the measure for reducing the parasitic capacity in the discontinuous structural body is of a measure taken from the viewpoint of suppressing the impedance mismatching. As for this point, in order to achieve an improvement in the signal transmission characteristics of the high frequency signal, there is a need to prevent degradation in the signal transmission characteristics at the through hole and the external coupling terminal each being the discontinuous structural body from being actualized by a new mechanism in addition to a loss due to signal reflection caused by the impedance mismatching.

A description will be made below about this point.

FIG. 1 is a diagram for describing a mechanism in which signal transmission characteristics are degraded. In FIG. 1, for example, a semiconductor chip CHP is mounted over a build-up layer BL1 of a wiring board WB comprised of a core layer CL, the build-up layer BL1 formed over the surface of the core layer CL, and a build-up layer BL2 formed beneath the back surface of the core layer CL. Then, a signal wiring SL1 comprised of, for example, a strip line or a microstrip line is formed at the surface of the build-up layer BL1. This wiring is coupled to the semiconductor chip CHP.

Next, as shown in FIG. 1, a ground wiring GL1 is formed at the surface of the core layer CL, and a land LND1 is formed thereat. Further, the core layer CL is formed with a through hole TH1 penetrating the core layer CL. The through hole TH1 is coupled to the land LND1. Further, a land LND2 coupled to the through hole TH1 is formed at the back surface of the core layer CL. A back surface terminal BT electrically coupled to the land LND2 is formed at the back surface of the build-up layer BL2. Here, in the present specification, a structural body in which the land LND1, the through hole TH1, the land LND2, and the back surface terminal BT are combined together will be referred to as a via structure VS1.

A solder ball SB1 being an external coupling terminal is adhered to the back surface terminal BT. The solder ball SB1 is coupled to a mounting board MB. Specifically, a signal wiring SL2 is formed at the surface of the mounting board MB, whereas a ground wiring GL is formed at the back surface of the mounting board MB. The solder ball SB1 is coupled to the signal wiring SL2 formed at the surface of the mounting board MB. Further, a solder ball SB2 supplied with a ground potential is also adhered to the back surface of the wiring board WB. The wiring board WB and the mounting board MB are coupled even via the solder ball SB2.

Figure 2:
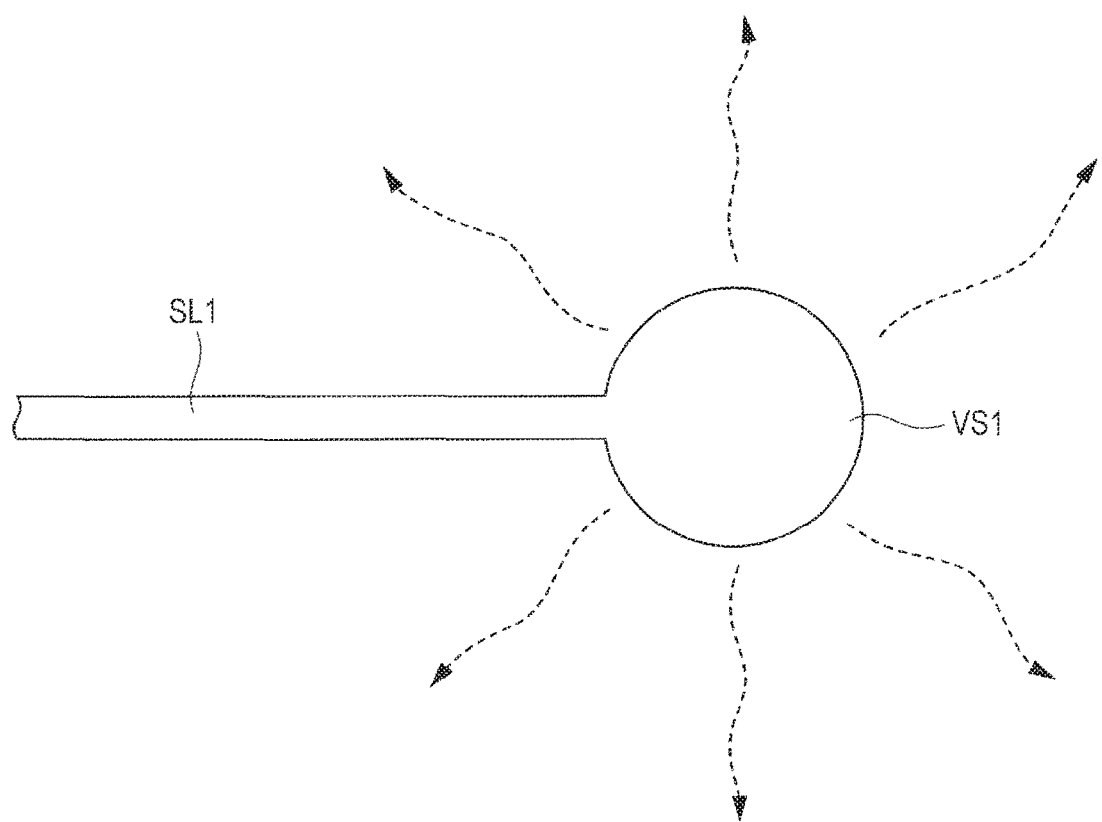
FIG. 2 is a diagram typically showing the manner in which an electromagnetic wave is diffused from a via structure coupled to a signal wiring.

Here, in FIG. 1, a thick arrow indicates a signal transmission direction. That is, a signal outputted from the semiconductor chip CHP is advanced along an x direction being a direction in which the signal wiring SL1 extends. Thereafter, the signal travels inside the via structure VS1 along a z direction being a direction of thickness of the core layer CL. Further, the signal travels through the solder ball SB1 interposed between the wiring board WB and the mounting board MB along the z direction and thereafter is advanced along the x direction being a direction in which the signal wiring SL2 formed at the surface of the mounting board MB extends. At this time, when the signal is propagated through the via structure VS1, an electromagnetic wave is excited by the via structure VS1. The excited electromagnetic wave is radially diffused centering on the via structure VS1 as indicated by wavy line in FIG. 1. As a result, a loss accompanying the radiation of the electromagnetic wave occurs, thereby incurring degradation in signal transmission characteristics. In particular, since the excitation efficiency of the electromagnetic wave rises as the frequency of the signal becomes higher, the signal high in frequency becomes large in loss when propagating through the via structure VS1, and the degradation in the signal transmission characteristics is actualized. For example, FIG. 2 is a diagram typically showing the manner in which the electromagnetic wave is diffused from the via structure VS1 coupled to the signal wiring SL1. As illustrated in FIG. 2, the electromagnetic is radially diffused from the via structure VS1.

From the above, even if the parasitic capacity of the via structure VS1 is reduced to suppress impedance mismatching, a leakage loss of the electromagnetic wave in the via structure VS1 will incur the degradation in the signal transmission characteristics.

<<Measures for Suppression of Leakage Loss of Electromagnetic Wave>>

Figure 3:
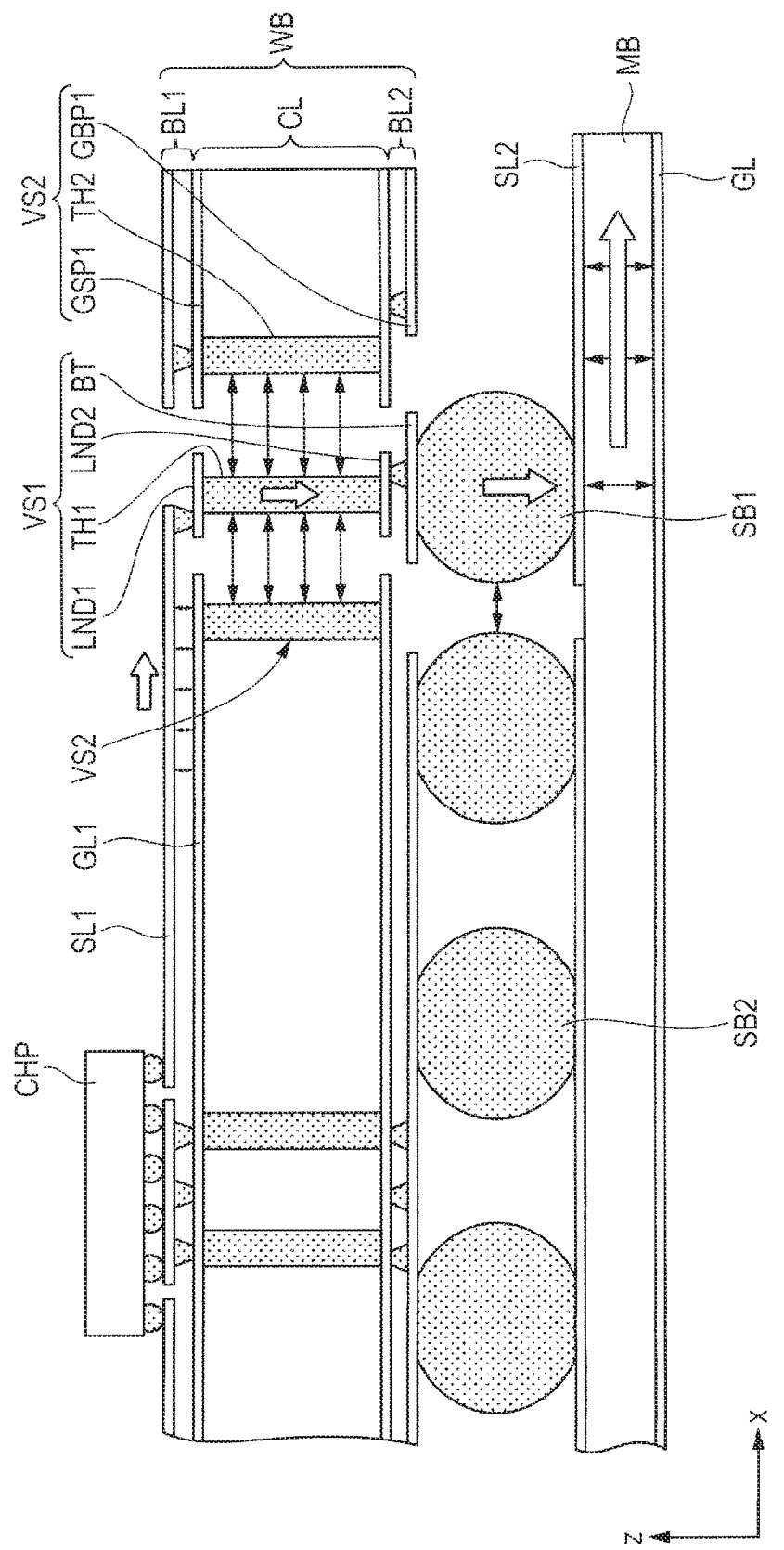
FIG. 3 is a diagram for describing a measure for suppressing a leakage loss of the electromagnetic wave in the via structure.

To this end, a structure illustrated in FIG. 3 has been proposed to suppress the diffusion of the electromagnetic wave in the via structure VS1 illustrated in FIG. 1. FIG. 3 is a diagram for describing a measure for suppressing the leakage loss of the electromagnetic wave in the via structure. In FIG. 3, a via structure VS2 supplied with a ground potential is formed around the via structure VS1. As illustrated in FIG. 3, the via structure VS2 includes a grounding surface pattern GSP1, a through hole TH2, and a grounding back surface pattern GBP1. The grounding surface pattern GSP1, the through hole TH2, and the grounding back surface pattern GBP1 are electrically coupled to one another.

Thus, the diffusion of the electromagnetic wave from the via structure VS1 is suppressed by arranging the via structure VS2 supplied with the ground potential around the via structure VS1 through which the signal passes. This is because as illustrated in FIG. 4, the diffusion of the electromagnetic wave is suppressed by a shield effect by the via structure VS2 supplied with the ground potential provided around the via structure VS1 and a reduction effect of diffusion space by arranging a plurality of via structures VS2 around the via structure VS1.

Figure 4:
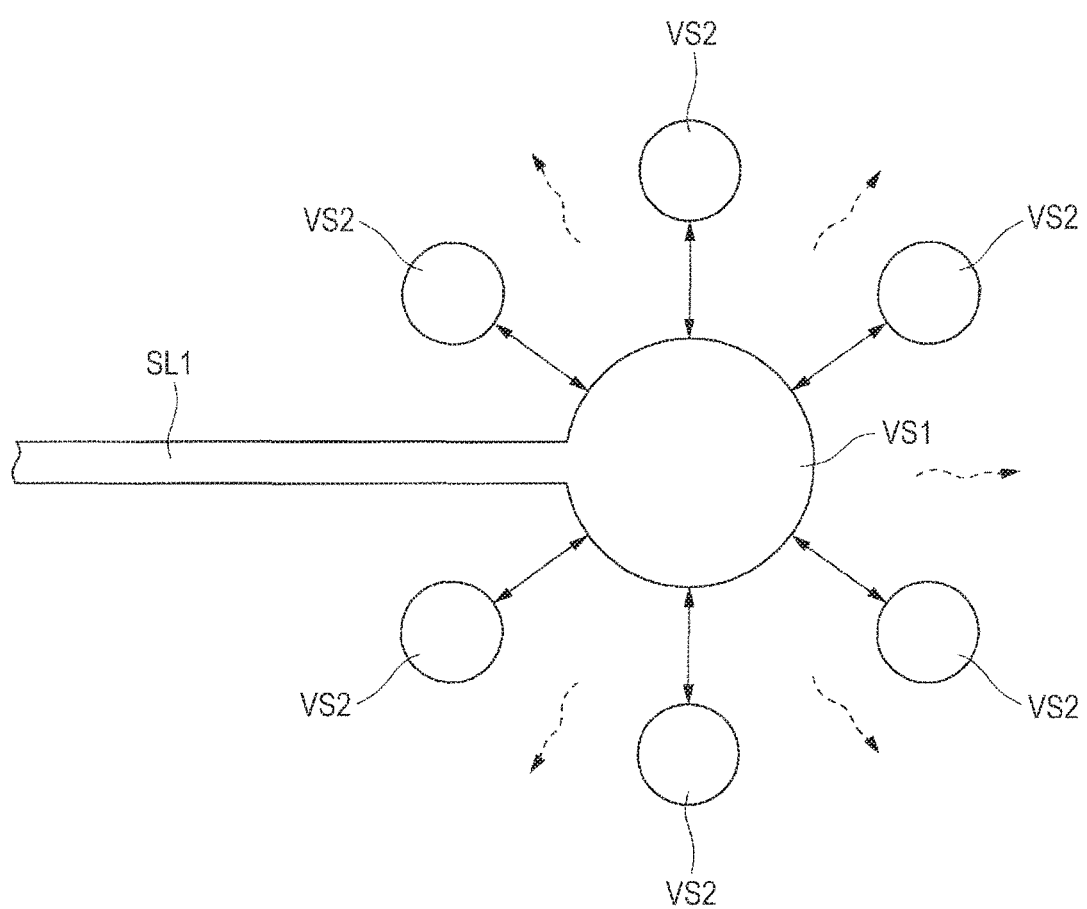
FIG. 4 is a diagram typically showing the manner in which an electromagnetic wave diffused from a first via structure coupled to a signal wiring is suppressed by arranging a plurality of second via structures supplied with a ground potential around the first via structure.

In FIG. 4, the manner in which the diffusion of the electromagnetic wave from the via structure VS1 is suppressed by providing the via structures VS2 each supplied with the ground potential around the via structure VS1 is typically shown. It is understood from FIG. 4 that the diffusion of the electromagnetic wave is suppressed by providing the visa structures VS2 each supplied with the ground potential around the via structure VS1. This means that the leakage loss of the signal traveling through the via structure VS1 is suppressed. It is thus possible to achieve an improvement in signal transmission characteristics.

<<New Phenomenon Newly Found by the Present Inventors Incurring Degradation in Signal Transmission Characteristics>>

However, the present inventors have newly found that a new phenomenon is actualized that makes it impossible to sufficiently attain an improvement in signal transmission characteristics in the structure illustrated in FIG. 3 that each via structure VS2 supplied with the ground potential is provided around the via structure VS1 where a high frequency signal of, for example, 80 GHz to 100 GHz is transmitted. This point will hereinafter be described.

Figure 5:
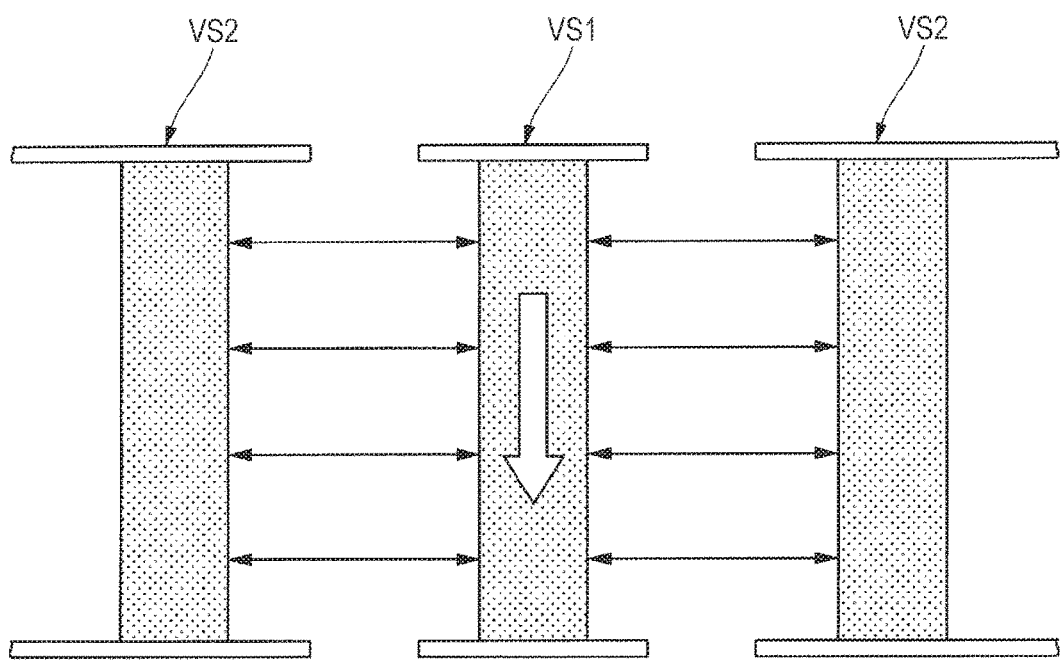
FIG. 5 is a diagram typically showing a case where the wavelength of the electromagnetic wave propagated through first via structure is sufficiently longer than the depths of the first and second via structures.

First, FIG. 5 is a diagram typically showing a case where the wavelength of the electromagnetic wave propagated through the via structure VS1 is sufficiently longer than the depths of the via structure VS1 and the via structure VS2. In FIG. 5, the via structures VS2 each supplied with the ground potential are provided around the via structure VS1. The diffusion of the electromagnetic wave is suppressed by providing the via structures VS2, so that a leakage loss of a signal propagated through the via structure VS1 is suppressed. That is, in FIG. 5, since the wavelength of the signal propagated through the via structure VS1 is sufficiently longer than the depths of the via structure VS1 and the via structure VS2, the magnitude of an electric field at the upper end of the via structure VS2 and the magnitude of an electric field at the lower end of the via structure VS2 can be assumed to be equal to each other. This means that the entire via structure VS2 is at the uniform ground potential. In this case, the leakage loss of the signal propagated through the via structure VS1 is suppressed by the shielding effect of each via structure VS2 supplied with the ground potential.

Figure 6:
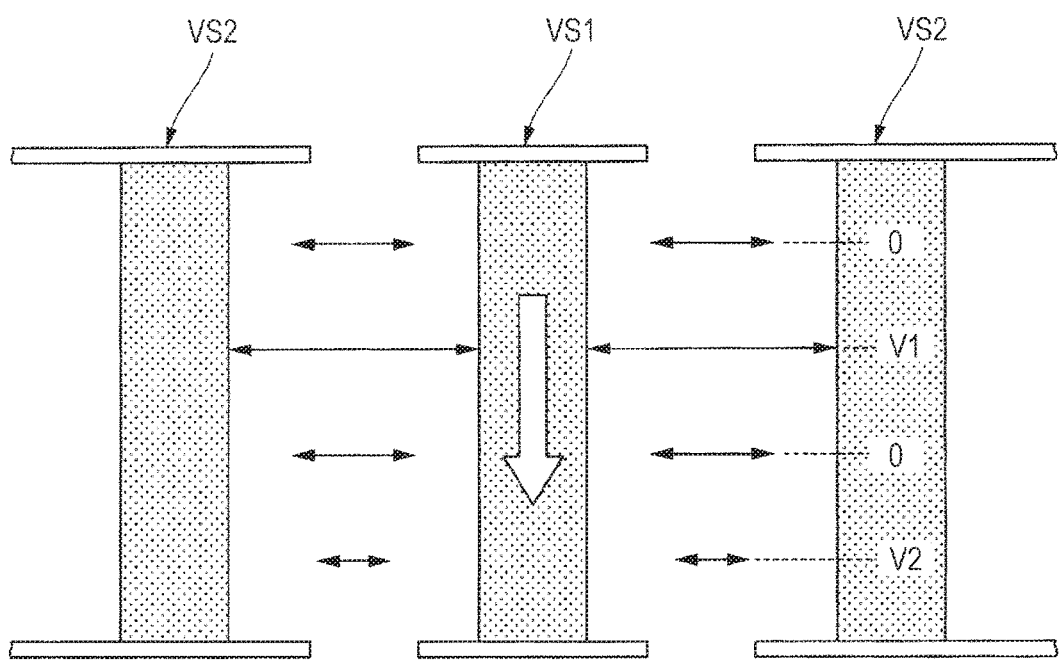
FIG. 6 is a diagram typically showing a case where the wavelength of a signal propagated through the first via structure becomes the same degree as the depth of each of the first and second via structures.

On the other hand, FIG. 6 is a diagram typically showing a case where the wavelength of the signal propagated through the via structure VS1 becomes approximately equal to the depths of the via structure VS1 and the via structure VS2. That is, FIG. 6 is a typical diagram used for analysis where the frequency of the signal becomes a high frequency of 80 GHz to 100 GHz. In FIG. 6, the via structures VS2 each supplied with the ground potential are provided around the via structure VS1, and the electric field of the signal propagated through the via structure VS1 is terminated by each via structure VS2. In the case of FIG. 6, however, the wavelength of the signal propagated through the via structure VS1 becomes approximately equal to the depth of the via structure VS1 and the depth of the via structure VS2. As a result, in the via structure VS2 supplied with the ground potential, a potential difference occurs thereinside. This is because the wavelength of the signal is brought to be approximately equal to the depth of the via structure VS2 so that the phase of the electromagnetic wave varies according to the depth position of the via structure VS2. Considering an electromagnetic wave of single sinusoidal wave, for example, the difference in potential generated in the via structure VS2 becomes the maximum when the difference in phase between the upper end of the via structure VS2 and the lower end of the via structure VS2 is π/2. That is, when the depth of the via structure VS2 is a ¼ wavelength, the potential difference of the via structure VS2 becomes the maximum. Thus, when the wavelength of the signal propagated through the via structure VS1 becomes approximately equal to the depths of the via structure VS1 and the via structure VS2, a potential difference in a z direction occurs inside the via structure VS2 which should originally be fixed to the ground potential. Further, the occurrence of the z-direction potential difference in the via structure VS2 means that an electric field occurs in the z direction. At this time, the occurrence of the electric field in the z direction means that a leakage electromagnetic wave advanced in an x direction orthogonal to the z direction is generated as indicated by thick broken line arrows in FIG. 7. That is, when the wavelength of the signal propagated through the via structure VS1 becomes approximately equal to the depths of the via structure VS1 and the via structure VS2, the leakage electromagnetic wave advanced in the x direction from the via structure VS2 occurs. As a result, when the signal flows in the z direction being the depth direction of the via structure VS1, the leakage electromagnetic wave illustrated in FIG. 7 leaks out from the via structure VS2, and hence the loss of the signal propagated in the z direction through the via structure VS1 becomes large. Thus, when the wavelength of the signal propagated through the via structure VS1 becomes approximately equal to the depths of the via structure VS1 and the via structure VS2, degradation in signal transmission characteristics is incurred due to the occurrence of the leakage electromagnetic wave illustrated in FIG. 7 even if the via structures VS2 each supplied with the ground potential are provided around the via structure VS1.

From the above, when the signal of the very high frequency ranging from 80 GHz to 100 GHz is transmitted, the leakage electromagnetic wave occurs in the direction orthogonal to the advancing direction of the signal even if the via structures VS2 each supplied with the ground potential are provided. Impedance matching between the characteristic impedance of the via structure VS1 and the characteristic impedance of the signal wiring SL1 is performed assuming the signal which advances inside the via structure VS1 in the depth direction (z direction) in particular. However, since the characteristic impedance varies according to the advancing direction of the signal in the via structure VS1, the characteristic impedance of the via structure VS1 abruptly changes when the wavelength of the signal comes close to the depth of the via structure VS1 and the leakage electromagnetic wave in the direction orthogonal to the original advancing direction is generated. Thus, when the signal of the very high frequency ranging from 80 GHz to 100 GHz is transmitted, the impedance matching with the signal wiring SL1 is lost, so that the signal is difficult to enter the via structure VS1, so-called signal reflection becomes large, and the signal entered into the via structure VS1 also leads to surrounding as the leakage electromagnetic wave, From this, when the signal of the very nigh frequency ranging from 80 GHz to 100 GHz is transmitted, it becomes difficult to attain an improvement in the signal transmission characteristics by the provision of the via structures VS2 each supplied with the ground potential around the via structure VS1 alone.

Thus, in the present embodiment 1, devising capable of improving the signal transmission characteristics is applied even where the signal of the very high frequency ranging from 80 GHz to 100 GHz is transmitted. A description will hereinafter be made about the technical idea in the present embodiment 1 to which this devising is applied.

<Technical Idea in Embodiment 1>

The technical idea in the present embodiment 1 is an idea that when the high frequency signal of the very high frequency ranging from 80 GHz to 100 GHz, for example is transmitted, the advancing direction of the high frequency signal in the via structure is made to be the direction orthogonal to the depth direction of the via structure and parallel to the advancing direction of the high frequency signal in the signal wiring coupled to the via structure without taking the depth direction of the via structure. Thus, according to the technical idea in the present embodiment 1, the advancing direction of the high frequency signal remains unchanged in the transmission path from the signal wiring formed at the surface of the wiring board to the signal wiring formed over the mounting board through the via structure. This means that according to the technical idea in the present embodiment 1, bending of the high frequency signal in its advancing direction is not generated in the transmission path from the signal wiring formed at the surface of the wiring board to the signal wiring formed over the mounting board through the via structure. That is, according to the technical idea in the present embodiment 1, geometrically, it seems likely that the via structure disappears where the electrical propagation of the high frequency signal is taken into consideration even if the via structure exists. In other words, according to the technical idea in the present embodiment 1, when the electrical propagation of the high frequency signal is considered, the transmission path from the signal wiring formed at the surface of the wiring board to the signal wiring formed over the mounting board through the via structure can be treated as if it were a single wiring in which the signal wiring formed at the surface of the wiring board and the signal wiring formed over the mounting board are made to be continuous. As a result, according to the technical idea in the present embodiment 1, it is possible to suppress degradation in the signal transmission characteristics of the high frequency signal due to the via structure formed in the wiring board. In other words, according to the technical idea in the present embodiment 1, even if the via structure exists in the transmission path for the high frequency signal, the transmission path becomes hard to be adversely affected by the via structure, so that the signal transmission characteristics of the high frequency signal can be enhanced.

Figure 7:
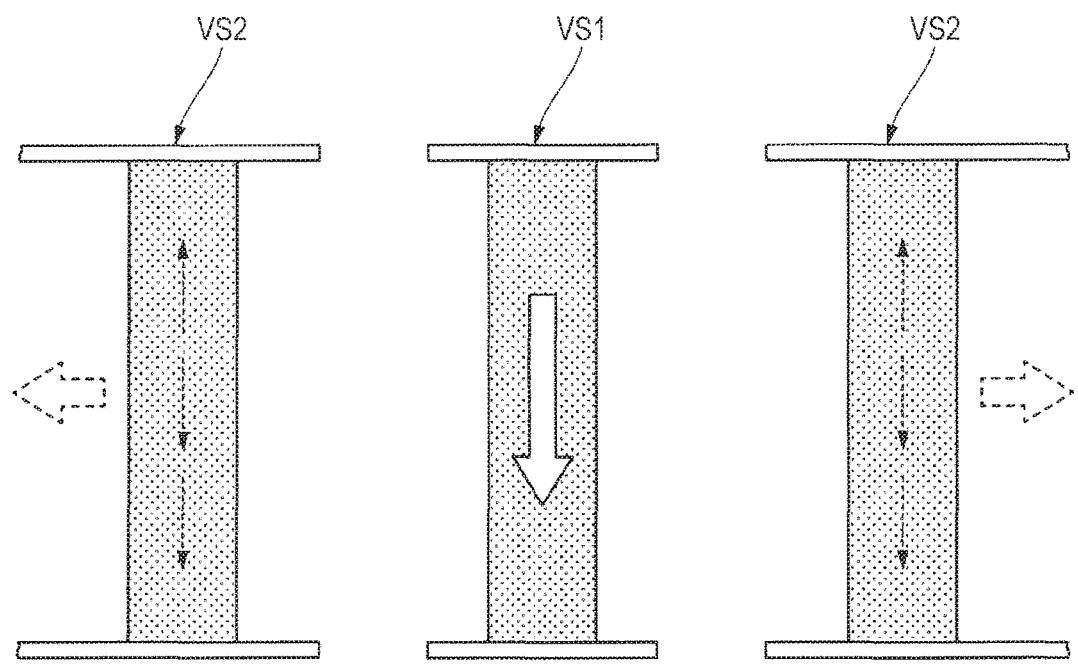
FIG. 7 is a typical diagram showing the manner in which a leakage electromagnetic wave is generated due to the occurrence of a potential difference inside the second via structure.

The technical idea in the present embodiment 1 has taken into consideration that when the high frequency signal of the very high frequency is transmitted, the potential difference occurs inside the via structure VS2 supplied with the ground potential even if, as illustrated in FIG. 7, for example, each via structure VS2 supplied with the ground potential is provided around the via structure VS1 through which the high frequency signal is propagated, so that the leakage electromagnetic wave is generated in the direction indicated by the thick broken line arrow. That is, when the high frequency signal flows in the z direction being the depth direction of the via structure VS1, the leakage electromagnetic wave illustrated in FIG. 7 leaks from the via structure VS2, thus increasing the loss of the high frequency signal propagated through the via structure VS1 in the z direction. Thus, when the wavelength of the high frequency signal propagated through the via structure VS1 becomes approximately equal to the depths of the via structures VS1 and VS2, the signal transmission characteristics are degraded due to the occurrence of the leakage electromagnetic wave illustrated in FIG. 7 even if each via structure VS2 supplied with the ground potential is provided around the via structure VS1. From the above reasons, in the technical idea in the present embodiment 1, the advancing direction of the high frequency signal in the via structure VS1 is made to be the direction perpendicular to the depth direction of the via structure VS1 and parallel to the advancing direction of the high frequency signal in the signal wiring coupled to the via structure VS1 without taking the depth direction of the via structure VS1 with respect to the high frequency signal having the wavelength being approximately equal to the depths of the via structures VS1 and VS2.

Summarizing the technical idea in the present embodiment 1 is as follows. That is, the semiconductor device in the present embodiment 1 is equipped with a semiconductor chip and a wiring board coupled to the semiconductor chip and couplable to a mounting board. At this time, the wiring board has a first wiring structure including a first wiring extending in a first direction (x direction), and a via structure including a through via coupled to the first wiring and extending in a second direction (z direction) orthogonal to the first direction. Further, the mounting board has a second wiring structure including a second wiring extending in the first direction and electrically coupled to the through via. Here, the technical idea in the present embodiment 1 is an idea that the advancing direction in the via structure, of a first signal of a first frequency (80 GHz or higher, for example) propagated over the first wiring structure, the via structure, and the second wiring structure is made to be the first direction.

<Conceptional Features for Realizing Technical Idea in the Embodiment 1>

Conceptional features for realizing the technical idea in the present embodiment 1 described above will hereinafter be described with reference to the accompanying drawings.

Figure 8:
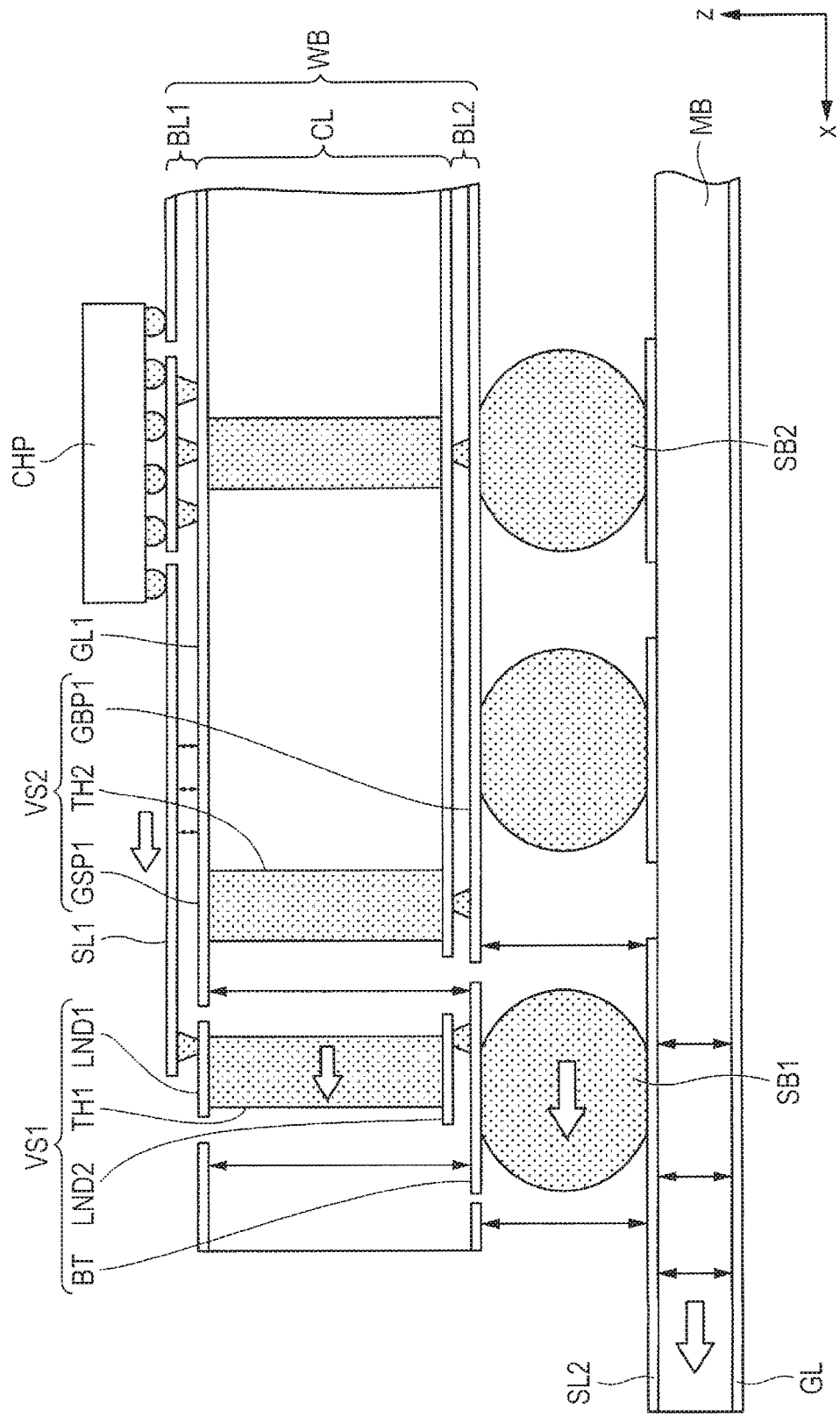
FIG. 8 is a diagram describing a technical idea in an embodiment 1.

FIG. 8 is a diagram for describing the technical idea in the present embodiment 1. In FIG. 8, in the semiconductor device in the present embodiment 1, a first wiring structure coupled to a semiconductor chip CHP extends in an x direction, and a high frequency signal is propagated in the x direction corresponding to the direction in which the first wiring structure extends. Specifically, as illustrated in FIG. 8, the semiconductor device in the present embodiment 1 is provided with the first wiring structure in which a signal wiring SL1 and a ground wiring GL1 extend in parallel to the x direction. At this time, as indicated by thin arrows in FIG. 8, the vibration of an electric field is produced between the signal wiring SL1 and the ground wiring GL1. Thus, since the advancing direction of the high frequency signal is made to be the direction perpendicular to the vibrating direction of the electric field, the advancing direction of the high frequency signal becomes the x direction in which the first wiring structure extends, as indicated by a thick arrow in FIG. 8.

Next, as illustrated in FIG. 8, the signal wiring SL1 is coupled to a via structure VS1, whereas the ground wiring GL1 is coupled to a via structure VS2. At this time, in the semiconductor device in the present embodiment 1, as indicated by the thick arrow in FIG. 8, the advancing direction of the high frequency signal in the via structure VS1 is made to be the x direction perpendicular to the depth direction of the via structure VS1 and parallel to the advancing direction of the high frequency signal in the signal wiring SL1 coupled to the via structure VS1 without taking the depth direction (z direction) of the via structure VS1.

Subsequently, as illustrated in FIG. 8, a wiring board WB and a mounting board MB are coupled to each other by a solder ball SB1. The advancing direction of the high frequency signal at the solder ball SB1 also becomes the x direction. Further, in the mounting board MB as illustrated in FIG. 8, a second wiring structure extends in the x direction, and the high frequency signal is propagated in the x direction being its extending direction. Specifically, as illustrated in FIG. 8, the mounting board MB in the present embodiment 1 is provided with the second wiring structure in which a signal wiring SL2 and a ground wiring GL extend in parallel in the x direction. At this time, the vibration of an electric field is produced between the signal wiring SL2 and the ground wiring GL as indicated by thin arrows in FIG. 8. Thus, since the advancing direction of the high frequency signal becomes the direction perpendicular to the direction of vibration of the electric field, the advancing direction thereof becomes the x direction in which the second wiring structure extends, as indicated by a thick arrow in FIG. 8.

From the above, as indicated by the thick arrows in FIG. 8, the advancing direction of the high frequency signal remains unchanged in a transmission path from the signal wiring SL1 formed at the surface of the wiring board WB to the wiring board SL2 formed over the mounting board MB through the via structure VS1. That is, in the technical idea in the present embodiment 1, when the electrical propagation of the high frequency signal is considered, the transmission path from the signal wiring SL1 formed at the surface of the wiring board WB to the signal wiring SL2 formed over the mounting board MB through the via structure VS1 and the solder ball SB1 can be treated as if it were a single wiring in which the signal wiring SL1 formed at the surface of the wiring board WB and the signal wiring SL2 formed over the mounting board MB are made to be continuous. As a result, according to the technical idea in the present embodiment 1, it is possible to suppress degradation in the signal transmission characteristics of the high frequency signal due to the via structure VS1 formed in the wiring board WB.

Here, the first feature point in the present embodiment 1 resides in a devising point for making the advancing direction of the high frequency signal in the via structure VS1 to assume the x direction perpendicular to the depth direction of the via structure VS1 and parallel to the advancing direction of the electromagnetic wave at the signal wiring SL1 coupled to the via structure VS1 without assuming the depth direction (z direction) of the via structure VS1 as indicated by the thick arrow in FIG. 8.

Specifically, the first feature point in the present embodiment 1 resides in that as illustrated in FIG. 8, for example, the via structure VS1 and the via structure VS2 have portions overlapped each other as seen in plan view.

When described in detail, the via structure VS1 includes a land LND1 formed at the surface of a core layer CL, a through hole TH1 coupled to the land LND1 and penetrating the core layer CL, and a back surface terminal BT electrically coupled to the through hole TH1 and formed at the back surface of a build-up layer BL2. On the other hand, the via structure VS2 includes a grounding surface pattern GSP1 formed at the surface of the core layer CL, and a through hole TH2 coupled to the grounding surface pattern GSP1 and penetrating the core layer CL.

At this time, the first feature point in the present embodiment 1 resides in that the back surface terminal BT and the grounding surface pattern GSP1 have portions overlapped each other as seen in plan view. Thus, according to the present embodiment 1, as illustrated in FIG. 8, for example, the electric field becomes easy to vibrate in the z direction between the grounding surface pattern GSP1 of the via structure VS2 and the back surface terminal BT of the via structure VS1, both of which overlap each other. That is, while the electric field is vibrated in the z direction between the signal wiring SL1 and the ground wiring GL1, the high frequency signal propagates through the first, wiring structure extending in the x direction and reaches the via structure VS1. At this time, in the present embodiment 1, since there exist the portions which overlap each other between the grounding surface pattern GSP1 of the via structure VS2 and the back surface terminal BT of the via structure VS1, the electric field becomes easy to vibrate in the z direction even when the high frequency signal propagates through the via structure VS1. That is, when the mutually overlapping portions exist between the grounding surface pattern GSP1 of the via structure VS2 and the back surface terminal BT of the via structure VS1, the vibration of the electric field in the z direction is induced in the high frequency signal propagated through the via structure VS1 as indicated by the thin arrows in FIG. 8. This means that when considering that the advancing direction of the high frequency signal becomes the direction perpendicular to the direction of vibration of the electric field, the advancing direction of the high frequency signal propagated through the via structure VS1 becomes the x direction indicated by the thick arrow in FIG. 8 without assuming the depth direction (z direction) of the via structure VS1. As a result, as illustrated in FIG. 8, the advancing direction of the high frequency signal in the via structure VS1 becomes the same x direction as the advancing direction of the high frequency signal in the first wiring structure. Thus, according to the first feature point in the present embodiment 1 that the via structure VS1 and the via structure VS2 have the portions overlapped each other, the advancing direction of the high frequency signal can be made not to change in the transmission path extending to pass through the via structure VS1 from the signal wiring SL1 (first wiring structure) formed at the surface of the wiring board WB. That is, the adoption of the configuration of the first feature point in the present embodiment 1 embodies the technical idea in the present embodiment 1 that the advancing direction of the high frequency signal in the via structure VS1 is made to be the direction perpendicular to the depth direction of the via structure VS1 and parallel to the advancing direction of the high frequency signal in the signal wiring SL1 coupled to the via structure VS1 without taking the depth direction of the via structure VS1. As a result, the adoption of the first feature point in the present embodiment 1 makes it possible to suppress degradation in the signal transmission characteristics of the high frequency signal due to the via structure VS1 formed in the wiring board WB.

Following the above, the second feature point in the present embodiment 1 premises the following points. That is, the second feature point in the present embodiment 1 is based on the premise that as illustrated in FIG. 8, for example, the via structure VS2 supplied with the ground potential includes a grounding back surface pattern GBP1 electrically coupled to the through hole TH2 and formed at the back surface of the build-up layer BL2. Further, the second feature point in the present embodiment 1 is based on the premise that the wiring board WB is coupled to the mounting board MB equipped with the semiconductor device, and the mounting board MB has the signal wiring SL2 electrically coupled to the via structure VS1. On the premise of this, the second feature point in the present embodiment 1 resides in that the grounding back surface pattern GBP1 and the signal wiring SL2 have portions overlapped each other in plan view.

Thus, according to the second feature point in the present embodiment 1, as illustrated in FIG. 8, for example, the electric field becomes easy to vibrate in the z direction between the grounding back surface pattern GBP1 of the via structure VS2 and the signal wiring SL2 of the mounting board MB, both of which overlap each other. That is, while the electric field is vibrating in the z direction, the high frequency signal propagates through the via structure VS1 and reaches the solder ball (external coupling terminal) SB1. At this time, in the present embodiment 1, since the mutually overlapping portions exist between the grounding back surface pattern GBP1 of the via structure VS2 and the signal wiring SL2 of the mounting board MB, the electric field becomes easy to vibrate in the z direction even when the high frequency signal propagates through the solder ball SB1. That is, when the mutually overlapping portions exist between the grounding back surface pattern GBP1 of the via structure VS2 and the signal wiring SL2 of the mounting board MB, the vibration of the electric field in the z direction is induced in the high frequency signal propagated through the solder ball SB1 as indicated by thin arrows in FIG. 8, for example. This means that when considering that the advancing direction of the high frequency signal becomes the direction perpendicular to the direction of vibration of the electric field, the advancing direction of the high frequency signal propagated through the solder ball SB1 is brought to the x direction indicated by the thick arrow in FIG. 8 without assuming the direction (z direction) of thickness of the solder ball SB1. As a result, as illustrated in FIG. 8, the advancing direction of the high frequency signal at the solder ball SB1 becomes the same x direction as the advancing direction of the high frequency signal in the via structure VS1. Thus, according to the second feature point in the present embodiment 1, the advancing direction of the high frequency signal can be prevented from varying in the transmission path extending to pass through the solder ball SB1 from the via structure VS1. That is, with the adoption of the configuration of the second feature point in the present embodiment 1, there is embodied the technical idea in the present embodiment 1 that the advancing direction of the high frequency signal at the solder ball SB1 is made to be the direction perpendicular to the thickness direction of the solder ball SB1 and parallel to the advancing direction of the high frequency signal in the signal wiring SL2 of the mounting board MB coupled to the solder ball SB1 without taking the thickness direction of the solder ball SB1. As a result, the adoption of the second feature point in the present embodiment 1 makes it possible to suppress degradation in the signal transmission characteristics of the high frequency signal due to the solder ball SB1.

From the above, the first feature point and the second feature point in the present embodiment 1 are combined together to thereby make the advancing direction of the high frequency signal not to be changed over the transmission path of the semiconductor chip CHP→the first wiring structure (signal wiring SL1+ground wiring GL1)→the via structure VS1→the solder ball SB1→the second wiring structure (signal wiring SL2+ground wiring GL) of the mounting board MB as indicated by the thick arrows in FIG. 8, for example. That is, when the electrical propagation of the high frequency signal is considered, the transmission path from the signal wiring SL1 formed at the surface of the wiring board WB to the signal wiring SL2 formed over the mounting board MB through the via structure VS1 and the solder ball SB1 can be treated as if it were a single wiring in which the signal wiring SL1 formed at the surface of the wiring board WB and the signal wiring SL2 formed over the mounting board MB are made to be continuous. As a result, according to the combination of the first and second feature points in the present embodiment 1, it is possible to suppress degradation in the signal transmission characteristics of the high frequency signal due to the via structure VS1 formed in the wiring board WB.

Figure 9:
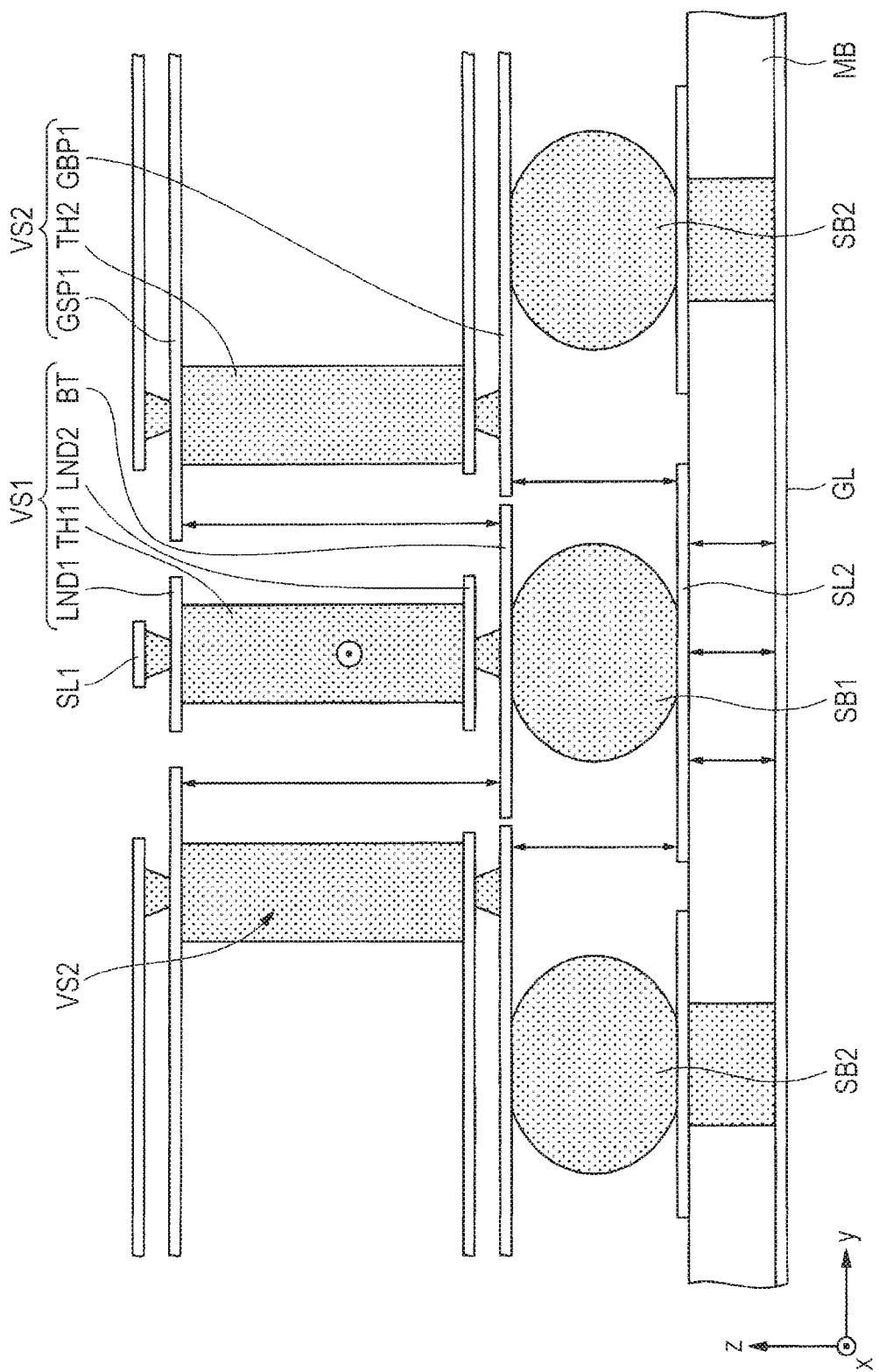
FIG. 9 is a diagram describing the technical idea in the embodiment 1.

FIG. 8 shows a sectional diagram in an x-z plane, but FIG. 9 shows a sectional diagram in a y-z plane when viewed from the other perspective. In FIG. 9, the high frequency signal is advanced from the back side of paper to its front side. At this time, it is understood even in the sectional diagram illustrated in FIG. 9 that the first feature point that the back surface terminal BT and the grounding surface pattern GSP1 have their mutually overlapping portions, and the second feature point that the grounding back surface pattern GBP1 and the signal wiring SL2 have their mutually overlapping portions have been embodied. Thus, it is understood that since the first feature point and the second feature point are embodied in both of FIGS. 8 and 9 showing the sectional diagrams in different directions to each other, the first feature point and the second feature point are planarly realized.

<Points to be Noted>

The technical idea in the present embodiment 1 is the idea that as illustrated in FIG. 8, for example, the advancing direction of the high frequency signal in the via structure VS1 is made to be the direction perpendicular to the depth direction of the via structure VS1 and parallel to the advancing direction of the high frequency signal in the signal wiring coupled to the via structure VS1 without taking the depth direction of the via structure VS1.

Here, as illustrated in FIG. 3, for example, a mode of propagating the high frequency signal in the depth direction (z direction) of the via structure VS1 will be called a "vertical transmission mode". On the other hand, as illustrated in FIG. 8, for example, a mode of propagating the high frequency signal in a horizontal direction perpendicular to the depth direction of the via structure VS1 will be called a "horizontal transmission mode".

At this time, it should be noted that in the technical idea in the present embodiment 1, the "horizontal transmission mode" is not realized over all frequency bands starting with 0 Hz.

FIG. 10 is a diagram showing the related art signal transmission method and the signal transmission method in the present embodiment 1 by comparison. In FIG. 10, in the related art signal transmission method, the "vertical transmission mode" is realized over all frequency bands. In this case, as for a signal in a low frequency band (frequency band smaller than 80 GHz), degradation in the signal transmission characteristics thereof can be suppressed by adopting the structure illustrated in FIG. 3. This is because as a result of causing no potential difference inside the via structure VS2 supplied with the ground potential, the leakage electromagnetic wave due to the potential difference generated inside the via structure VS2 is not generated.

In the related art signal transmission method, however, when a high frequency signal (electromagnetic wave) of 80 GHz or higher is propagated, the leakage electromagnetic wave is generated in the horizontal direction in the via structure VS1 by the mechanism illustrated in FIG. 7. That is, when the nigh frequency signal of 80 GHz or higher is propagated in the "vertical transmission mode", the high frequency signal is not propagated in the vertical direction by the synergistic factors of the point that the leakage electromagnetic wave diffused in the horizontal direction is generated so that a loss in the signal becomes remarkable, and the point that the horizontally diffused leakage electromagnetic wave exists in mixed form together with the high frequency signal advanced in the vertical direction so that the characteristic impedance of the via structure VS1 is drastically deviated.

In contrast, in the signal transmission method in the present embodiment 1, the "vertical transmission mode" is set as with the related art signal transmission method with respect to the propagation of the electromagnetic wave in the low frequency band. On the other hand, in the signal transmission method in the present embodiment 1, the "horizontal transmission mode" is guided with respect to the propagation of the high frequency signal by the configurations of the first and second feature points in the present embodiment 1 described above. Then, in the present "horizontal transmission mode", the leakage electromagnetic wave can also be recovered as the component of the high frequency signal when considering the point that the discontinuous structural body having the characteristic impedance caused by the via structure VS1 can electrically be treated as if it were not present, and that the leakage electromagnetic wave itself is diffused in the horizontal direction. As a result, the signal transmission method in the present embodiment 1 is capable of attaining an improvement in the signal transmission characteristics by adopting the "horizontal transmission mode" other than the "vertical transmission mode" for the propagation of the high frequency signal. That is, in the technical idea in the present embodiment 1, the "vertical transmission mode" is set for the low frequency signal, whereas the "horizontal transmission mode" is set for the high frequency signal. It can be said that it is correct to understand that the component of the "horizontal transmission mode" gradually increases to the "vertical transmission mode" as the frequency of the signal rises, without digitally realizing switching between the modes. That is, the master is taken as the "vertical transmission mode" and the slave is taken as the "horizontal transmission mode" with respect to the low frequency signal. On the other hand, as the frequency of the signal increases, the master is taken as the "horizontal transmission mode" and the slave is taken as the "vertical transmission mode", and the "vertical transmission mode" is converted to the leakage electromagnetic wave diffused in the horizontal direction. From this of view, according to the signal transmission method in the present embodiment 1, the leakage electromagnetic wave can also be recovered as the component of the high frequency signal by inducing the high frequency signal so as to propagate in the "horizontal transmission mode". Thus, according to the signal transmission method in the present embodiment 1, an improvement in the signal transmission characteristics can be achieved even with respect to the high frequency signal of 80 GHz or higher.

Thus, in the technical idea in the present embodiment 1, for example, the advancing direction in the via structure, of the high frequency signal having the first frequency (frequency of 80 GHz or higher) propagated over the first wiring structure, the via structure, and the second wiring structure is the same as the advancing direction of the high frequency signal in the first wiring structure and the advancing direction of the high frequency signal in the second wiring structure. On the other hand, in the technical idea in the present embodiment 1, for example, the advancing direction in the via structure, of the low frequency signal having the first frequency (frequency sufficiently smaller than 80 GHz)

propagated over the first wiring structure, the via structure, and the second wiring structure is orthogonal to the advancing direction of the high frequency signal in the first wiring structure and the advancing direction of the high frequency signal in the second wiring structure. That is, it can be said that the technical idea in the present embodiment 1 is assumed to be an idea that the advancing direction of the signal is switched according to the frequency band of the signal.

<Modification>

A description will subsequently be made about a modification of the present embodiment 1. For example, the first feature point that the back surface terminal BT and the grounding surface pattern GSP1 have their mutually overlapping portions, and the second feature point that the grounding back surface pattern GBP1 and the signal wiring SL2 have their mutually overlapping portions have been embodied in FIG. 9. However, upon embodying the technical idea in the present embodiment 1, the configuration of enabling the "horizontal transmission mode" to be guided may substantially be embodied as well as the first and second feature points described above.

Concretely, FIG. 11 is a diagram, typically showing a configuration example of realizing the "horizontal transmission, mode" in the present modification. There is shown, in FIG. 11 one cross-section obtained by cutting both the via structures VS1 and VS2, which is one cross-section parallel to the direction of thickness of the wiring board WB, In FIG. 11, the technical idea in the present embodiment 1 can be embodied even as a configuration in which when the angle formed by a line segment connecting a terminal portion TP1 of the back surface terminal BT and a terminal portion TP2 of the grounding surface pattern GSP1 and a vertical line (dotted line) passing the terminal portion TP1 is assumed to be $\phi_1$, a relation of cos $\phi_1 \geq 0.89$ is established (third feature point). Likewise, when the angle formed by a line segment connecting a terminal portion TP3 of the signal wiring SL2 and a terminal portion TP4 of the grounding back surface pattern GBP1 and a vertical line (dotted line) passing the terminal portion TP3 is assumed to be $\phi_2$, a relation of cos $\phi_2 \geq 0.89$ is established (third feature point).

In order to guide the "horizontal transmission mode", as illustrated in FIG. 9, for example, the configuration of adopting the first feature point that the back surface terminal BT and the grounding surface pattern GSP1 have their mutually overlapping portions, and the second feature point that the grounding back surface pattern GBP1 and the signal wiring SL2 have their mutually overlapping portions is desirable.

As illustrated in FIG. 11, however, the "horizontal transmission mode" can be guided even by the third feature point even without adopting the first, and second feature points described above. This is because the electric field vibrated in the z direction can be induced even at the third feature point by the diffraction phenomenon of the high frequency signal. When the third feature point is adopted instead of adopting the first and second feature points described above, the z-direction component of the electric field is reduced by the inclinations represented by "cos $\phi_1$" and "cos $\phi_2$". However, specifically, when a decrease up to "−1 dB" is assumed to be an allowable range, the "horizontal transmission mode" can be guided in a range in which "cos $\phi_1 \geq 0.89$" and "cos $\phi_2 \geq 0.89$" are established, in the present modification.

Embodiment 2

<Package Structural Body Embodying Technical Idea>

The present embodiment 2 will describe one example of a package structural body having embodied the technical idea in the embodiment 1 while referring to the accompanying drawings.

Figure 12:
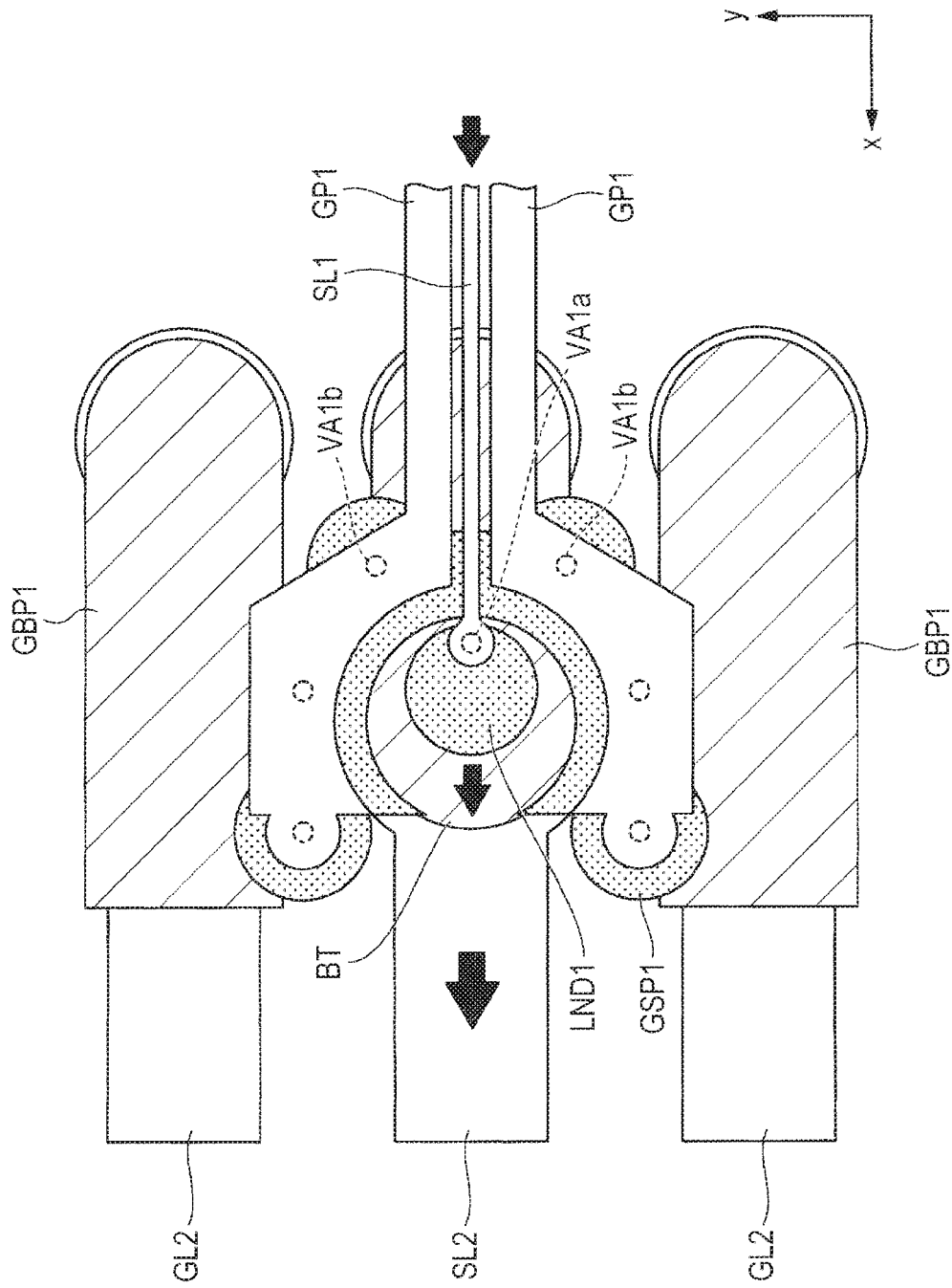
FIG. 12 is a plan diagram showing wiring patterns formed over a mounting board and conductor patterns formed in each wiring layer of a wiring board having a multi-layer wiring layer in an overlapped form on a planar basis.

FIG. 12 is a plan diagram showing wiring patterns formed over a mounting board and conductor patterns formed in each wiring layer of a wiring board having a multi-layer wiring layer in an overlapped form on a planar basis. In FIG. 12, the wiring board has a core layer, a first build-up layer formed over the surface of the core layer, and a second build-up layer formed below the back surface of the core layer. First, in FIG. 12, a signal wiring SL1 extending in an x direction and a ground pattern GP1 arranged around the signal wiring SL1 are formed at the surface of the first build-up layer of the wiring board. Then, as illustrated in FIG. 12, the signal wiring SL1 is coupled to a land LND1 formed at the surface of the core layer of the wiring board through a via VA1a. Further, the ground pattern GP1 is coupled to a grounding surface pattern GSP1 formed at the surface of the core layer of the wiring board through a plurality of vias VA1b.

Figure 13:
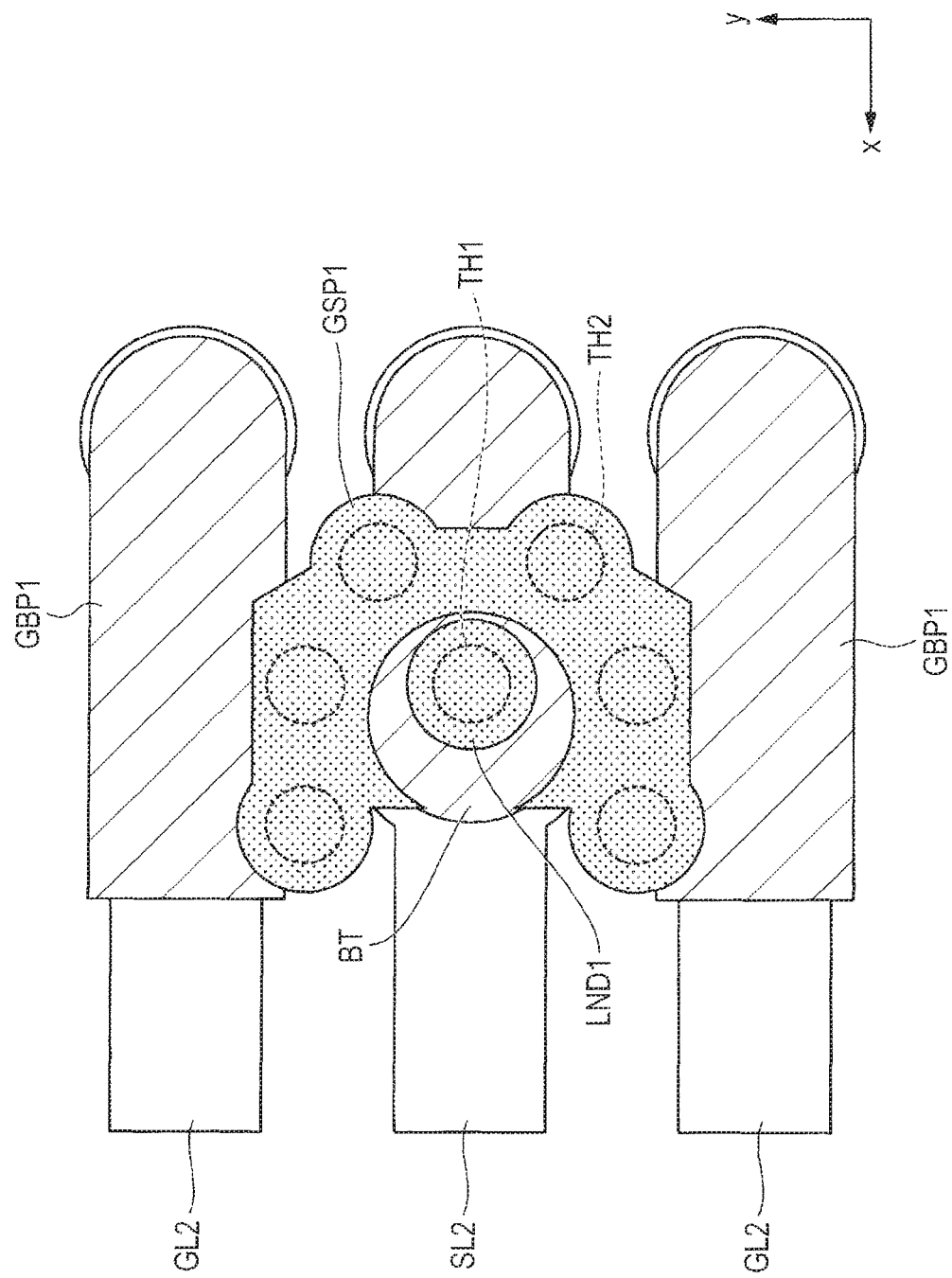
FIG. 13 is a diagram showing the surface of a core layer in an omitted form of a signal wiring and a ground pattern formed at the surface of a first build-up layer.

Next, FIG. 13 is a diagram showing the surface of the core layer in an omitted form of the signal wiring SL1 and the ground pattern GP1 formed at the surface of the first build-up layer. In FIG. 13, the land LND1 and the grounding surface pattern GSP1 arranged around the land LND1 are formed at the surface of the core layer. At this time, as illustrated in FIG. 13, the land LND1 is coupled to a through hole TH1 penetrating the core layer. Further, the grounding surface pattern GSP1 is coupled to a plurality of through holes TH2.

Figure 14:
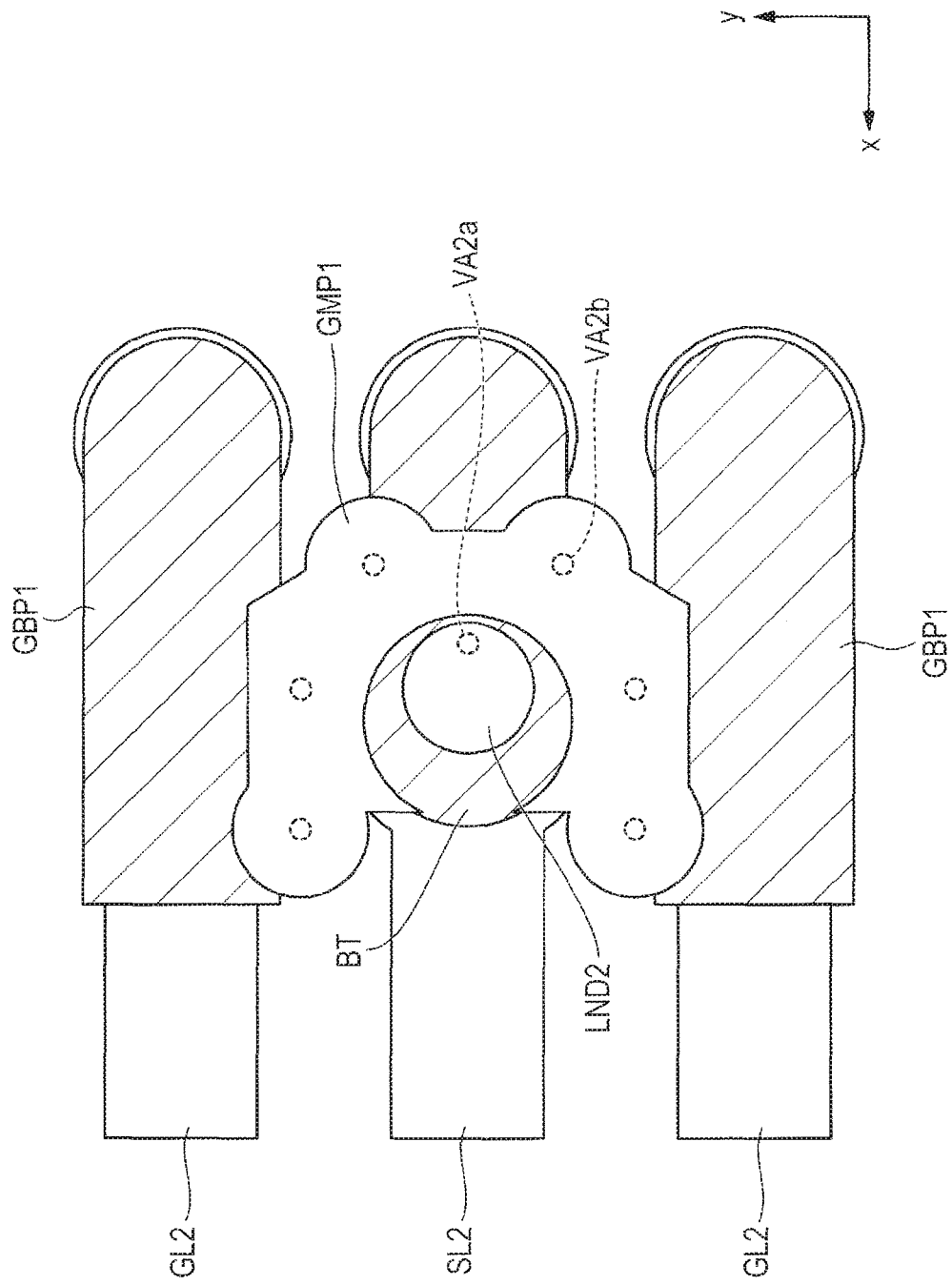
FIG. 14 is a diagram showing the back surface of the core layer in an omitted form of a land and a grounding surface pattern formed at the surface of the core layer.

Following the above, FIG. 14 is a diagram showing the back surface of the core layer in an omitted form of the land LND1 and the grounding surface pattern GSP1 formed at the surface of the core layer. In FIG. 14, a land LND2 and a grounding middle pattern GMP1 arranged around the land LND2 are formed at the back surface of the core layer. At this time, the land LND2 illustrated in FIG. 14 is coupled to the land LND1 illustrated in FIG. 13 by the through hole TH1. On the other hand, the grounding middle pattern GMP1 illustrated in FIG. 14 is coupled to the grounding surface pattern GSP1 illustrated in FIG. 13 by the plural through holes TH2. Further, the land LND2 illustrated in FIG. 14 is coupled to a back surface terminal BT through a via VA2a. Also, the grounding middle pattern GMP1 illustrated in FIG. 14 is coupled to a grounding back surface pattern GBP1 through a plurality of vias VA2b.

Figure 15:
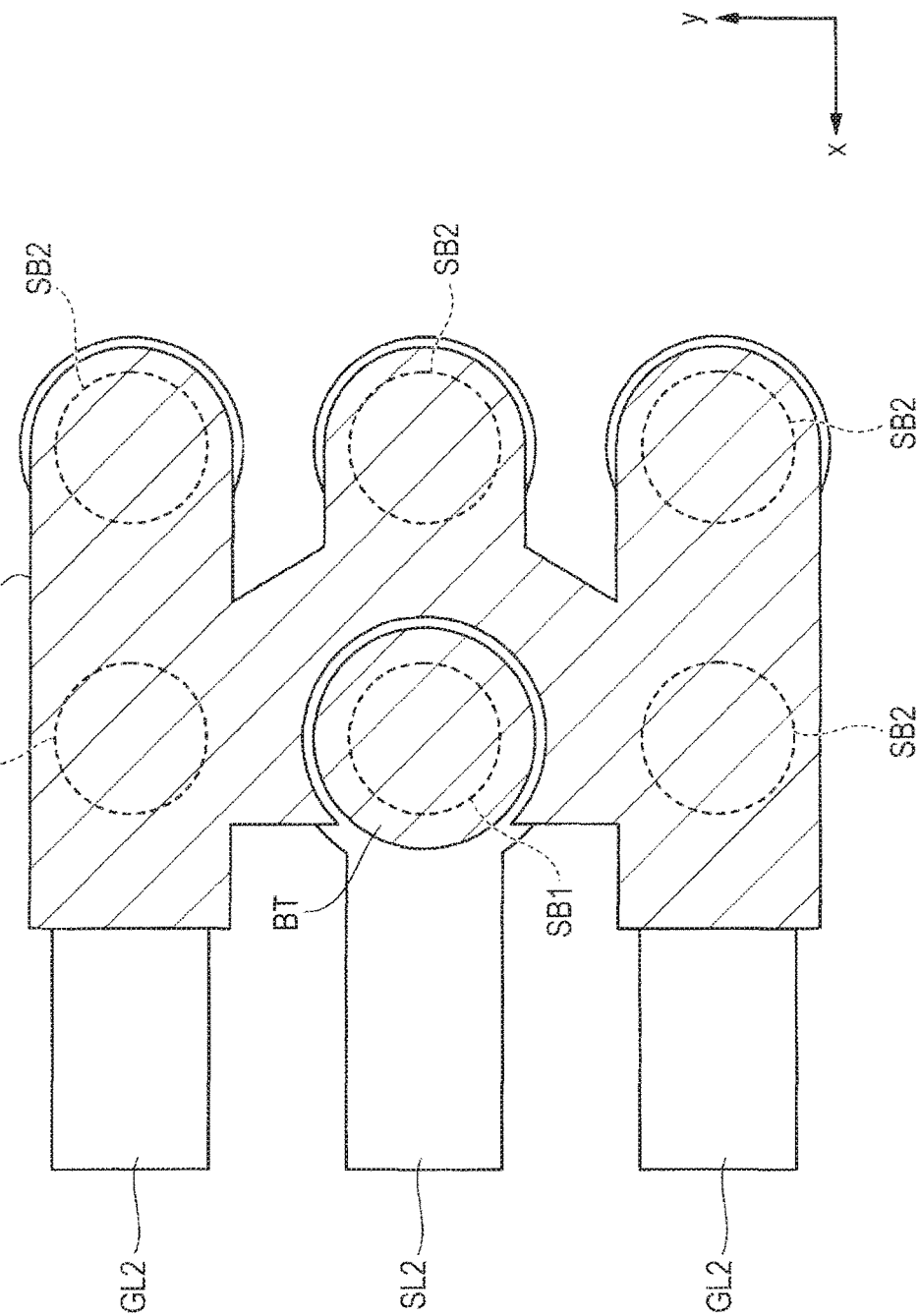
FIG. 15 is a diagram showing the back surface of a second build-up layer in an omitted form of a land and a grounding middle pattern formed at the back surface of the core layer.

Next, FIG. 15 is a diagram showing the back surface of the second build-up layer in an omitted form of the land LND2 and the grounding middle pattern GMP1 formed at the back surface of the core layer. In FIG. 15, the back surface terminal BT and the grounding back surface pattern GBP1 arranged around the back surface terminal BT are formed at the back surface of the second build-up layer. Then, the back surface terminal BT is partly surrounded by the grounding back surface pattern GBP1 as seen in plan view. Also, the back surface terminal BT illustrated in FIG. 15 is coupled to a solder ball SB1, Likewise, the grounding back surface pattern GBP1 illustrated in FIG. 15 is coupled to a plurality of solder balls SB2.

Figure 16:
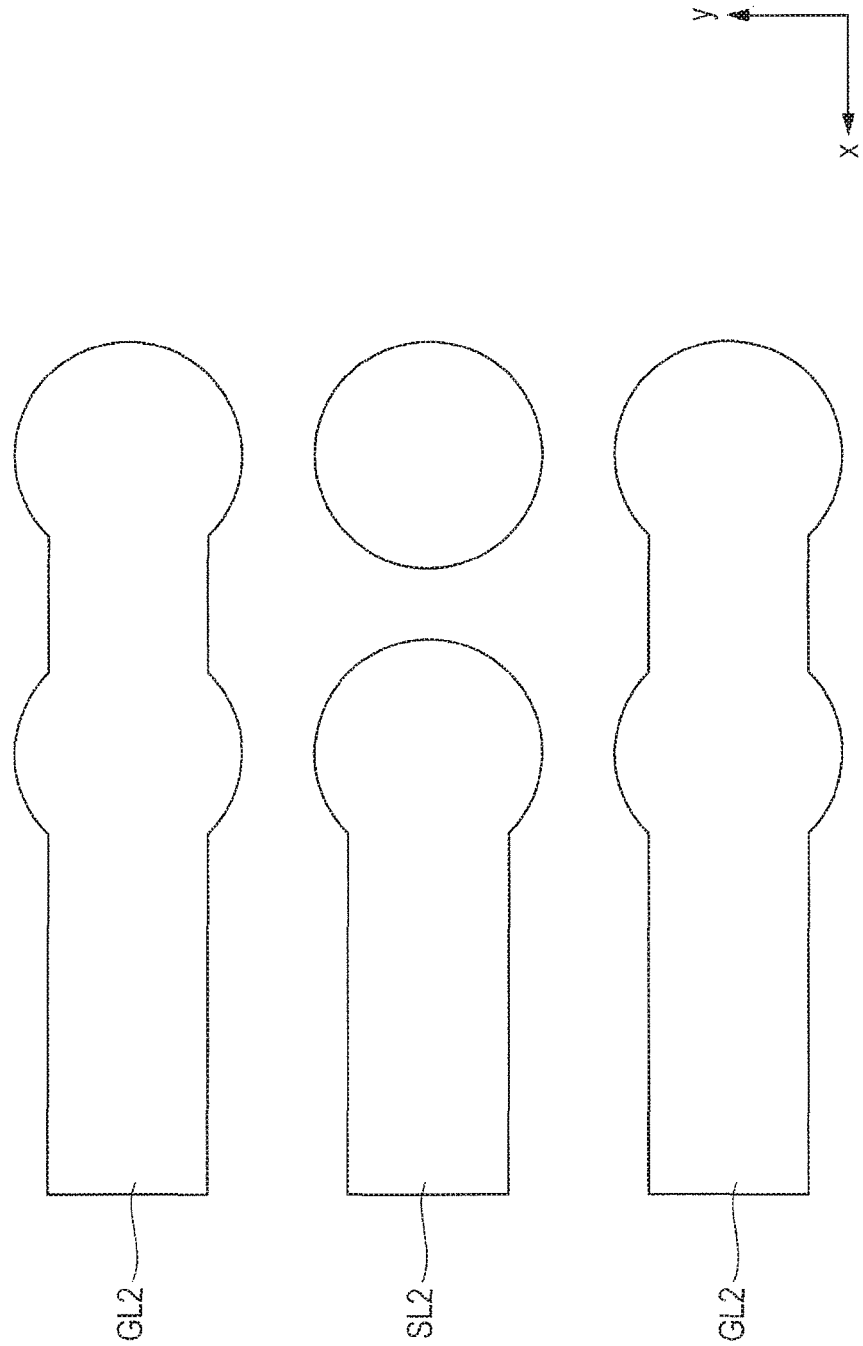
FIG. 16 is a diagram snowing the surface of the mounting board in an omitted form of a back surface terminal and a grounding back surface pattern formed at the back surface of the second build-up layer.

Subsequently, FIG. 16 is a diagram showing the surface of the mounting board in an omitted form of the back surface terminal BT and the grounding back surface pattern GBP1 formed at the back surface of the second build-up layer. In FIG. 16, a signal wiring SL2 extending in the x direction and ground wirings GL2 arranged so as to interpose the signal wiring SL2 therebetween with being separated from the signal wiring SL2 are formed at the surface of the mounting board.

The coupling between the wiring board and the mounting board is realized in the above-described manner.

<Features in Embodiment 2>

A description will next be made about a feature point in the present embodiment 2. In the present embodiment 2, as illustrated in FIG. 13, for example, the planar size of the back surface terminal BT formed at the back surface of the second build-up layer is larger than the planar size of an opening region provided at the grounding surface pattern GSP1 formed at the surface of the core layer as seen in plan view. Thus, the first feature point described in the embodiment 1 that the back surface terminal BT and the grounding surface pattern GSP1 have their mutually overlapping portions is realized. Likewise, in the present embodiment 2, the signal wiring SL2 formed at the surface of the mounting board and the grounding back surface pattern GBP1 formed at the back surface of the second build-up layer have their mutually overlapping portions as seen in plan view as illustrated in FIG. 15. Consequently, the second feature point described in the embodiment 1 is realized. Thus, in the present embodiment 2, the first feature point and the second feature point both described in the embodiment 1 are embodied. As a result, according to the present embodiment 2, when the high frequency signal of 80 GHz or higher is propagated through the via structure and the solder ball, the "horizontal transmission mode" is guided. Therefore, according to the present embodiment 2, it is possible to improve the signal transmission characteristics of the high frequency signal.

Figure 17:
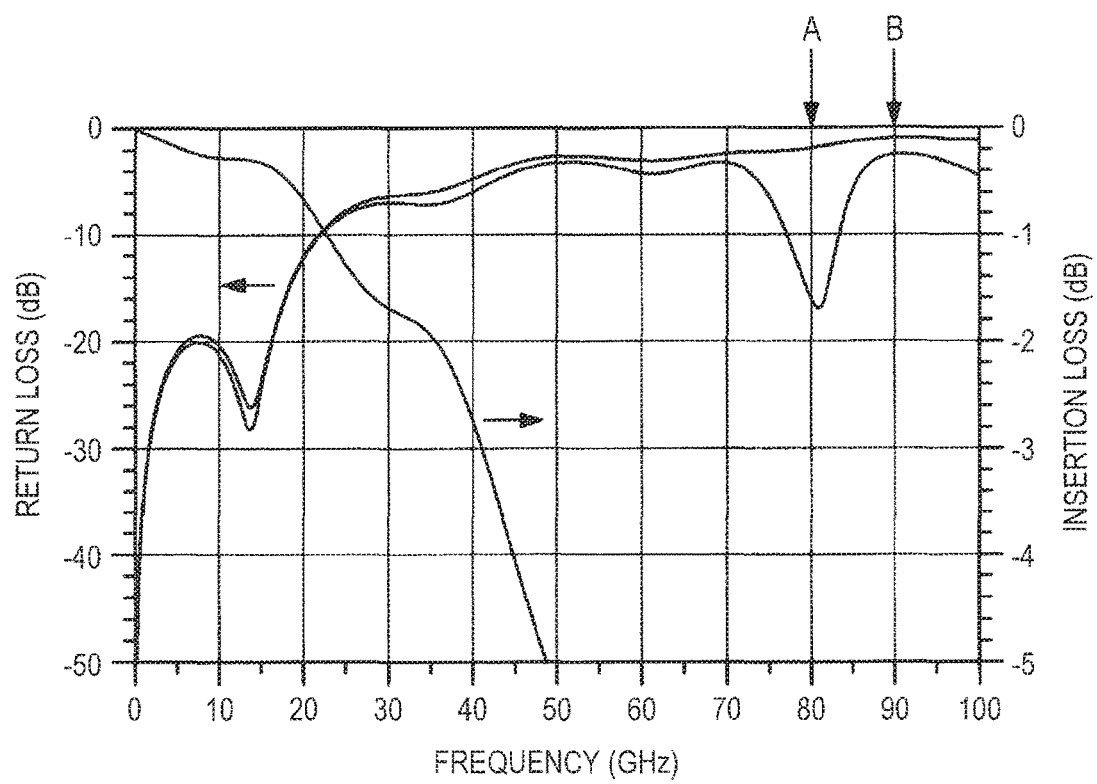
FIG. 17 is a graph showing a relationship between the frequency of a signal and a return loss thereof, and a relationship between the frequency of a signal and an insertion loss thereof in a related art.

FIG. 17 is a graph showing a relationship between the frequency of a signal and a return loss thereof, and a relationship between the frequency of a signal and an insertion loss thereof in a related art which does not adopt the feature point in the present embodiment 2. In FIG. 17, the horizontal axis indicates the frequency (GHz) of the signal. On the other hand, the vertical axis (left side) indicates the return loss (dB) (return loss from the semiconductor chip side and return loss from the mounting board side). The vertical axis (right side) indicates the insertion loss (dB). When the frequency of a signal indicated at a point A is 80 GHz in FIG. 17, the insertion loss becomes about −15 dB (protruded from FIG. 17) much larger than −5 dB, and the return loss becomes −15 dB or less. Further, when the frequency of a signal indicated at a point B is 90 GHz in FIG. 17, the insertion loss becomes about −15 dB (protruded from FIG. 17), and the return loss becomes −4 dB or more. Thus, it is understood in the related art that when the signal of 80 GHz or higher is transmitted, the insertion loss and the return loss become very large, and hence the related art is not capable of withstanding practical use.

Figure 18:
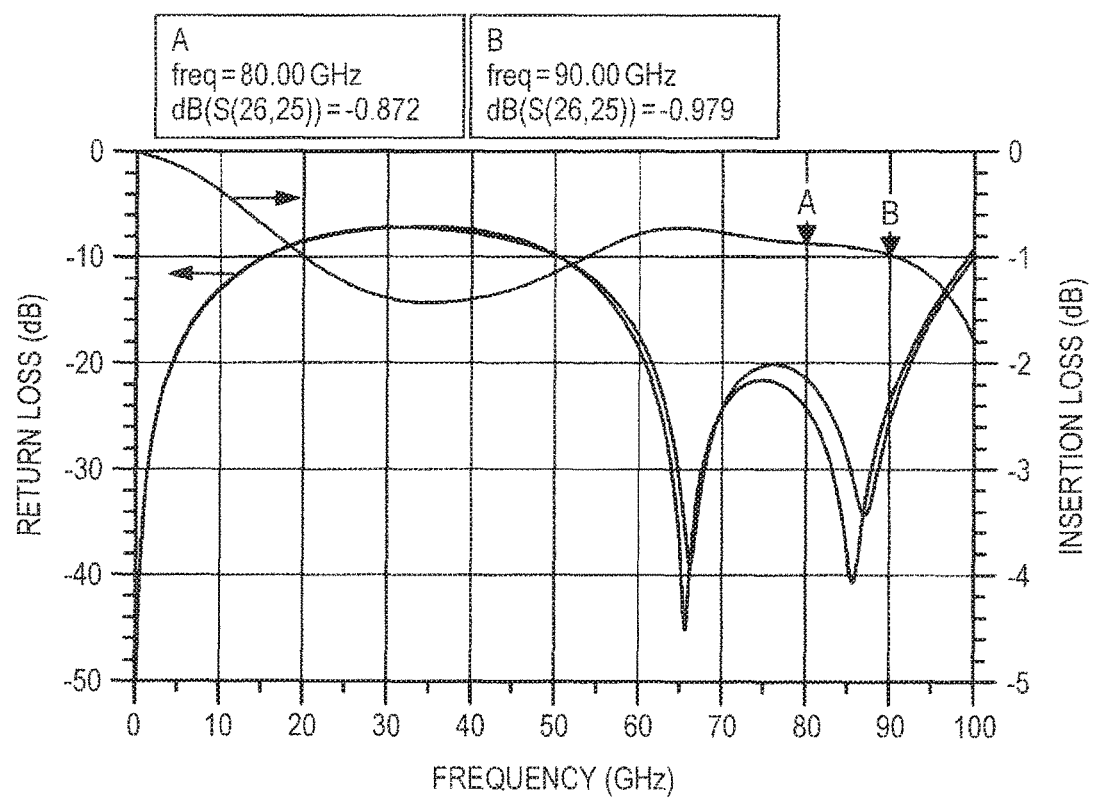
FIG. 18 is a graph showing a relationship between the frequency of a signal and a return loss thereof, and a relationship between the frequency of a signal and an insertion loss thereof.

In contrast, FIG. 18 is a graph showing a relationship between the frequency of a signal and a return loss thereof, and a relationship between the frequency of a signal and an insertion loss thereof where the package structure in the present embodiment 2 is adopted. In FIG. 18, the horizontal axis indicates the frequency (GHz) of the signal. On the other hand, the vertical axis (left side) indicates the return loss (dB), and the vertical axis (right side) indicates the insertion loss (dB). When the frequency of a signal indicated at a point A is 80 GHz in FIG. 18, the insertion loss becomes −0.872 dB, and the return loss becomes −20 dB or less. Further, when the frequency of a signal indicated at a point B is 90 GHz in FIG. 18, the insertion loss becomes −0.979 dB, and the return loss becomes −20 dB or less. Thus, according to the present embodiment 2, it is understood that when the signal of 80 GHz or higher is transmitted, the insertion loss can be suppressed to −1 dB or less, and the return loss can be reduced to −20 dB or less, Thus, it is corroborated from the result shown in FIG. 18 that the signal transmission characteristics of the high frequency signal can be improved according to the combination of the first feature point and the second feature point both embodied in the present embodiment 2. That is, according to the present embodiment 2, it is understood that when the high frequency signal of 80 GHz or higher is used, for example, it is possible to obtain excellent signal transmission characteristics which cannot be obtained by the related art.

Another feature point in the present embodiment 2 will next be described. Another feature point in the present embodiment 2 resides in that a cutout portion provided in the grounding surface pattern GSP1 is present on an extension in the x direction in which the first wiring structure (signal wiring SL1+ground pattern GP1) extends, as seen in plan view as illustrated in FIG. 12, for example. Thus, according to the present embodiment 2, the advancing direction of the high frequency signal propagated through the first wiring structure, the advancing direction of the high frequency signal propagated through the via structure and the external coupling terminal, and the advancing direction of the high frequency signal propagated through the second wiring structure (signal wiring SL2) can all be aligned in the same x direction as indicated by thick black arrows. That is, according to another feature point in the present embodiment 2, the advancing direction of the high frequency signal outputted from the via structure and the external coupling terminal (solder ball) can be controlled in the x direction by the cutout portion. Namely, the high frequency signal inputted from the first wiring structure to the via structure is propagated along the overlapping portions (side surfaces) of the back surface terminal BT and the grounding surface pattern GSP1 in the "horizontal transmission mode" guided by the first feature point and the second feature point and thereafter guided to be outputted in the x direction by the cutout portion. That is, the cutout portion being another feature point in the present embodiment 2 has the function of guiding the outputting direction of the high frequency signal outputted from the via structure and the external coupling terminal (solder ball) to the x direction being the extending direction of the signal wiring SL2.

Thus, according to the present embodiment 2, when the electrical propagation of the nigh frequency signal is considered, the transmission path extending from the first wiring structure to the second wiring structure formed in the mounting board through the via structure and the external coupling terminal (solder ball) can be treated as if it were a single wiring in which the first wiring structure and the second wiring structure are made to be continuous. As a result, according to the present embodiment 2, it is possible to suppress degradation in the signal transmission characteristics due to the via structure and the external coupling terminal (solder ball).

Figure 19:
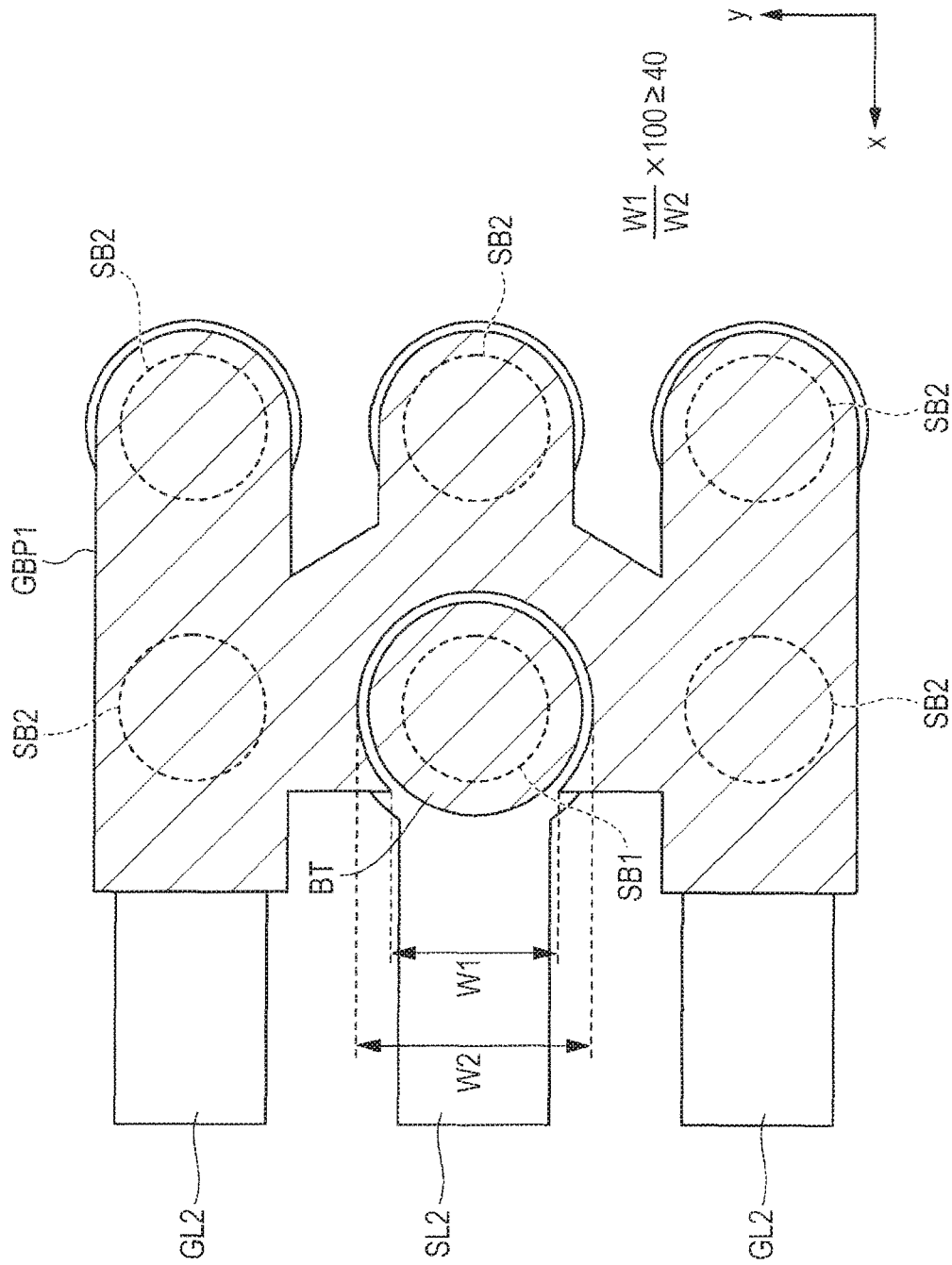
FIG. 19 is a diagram describing an opening ratio.
Figure 20:
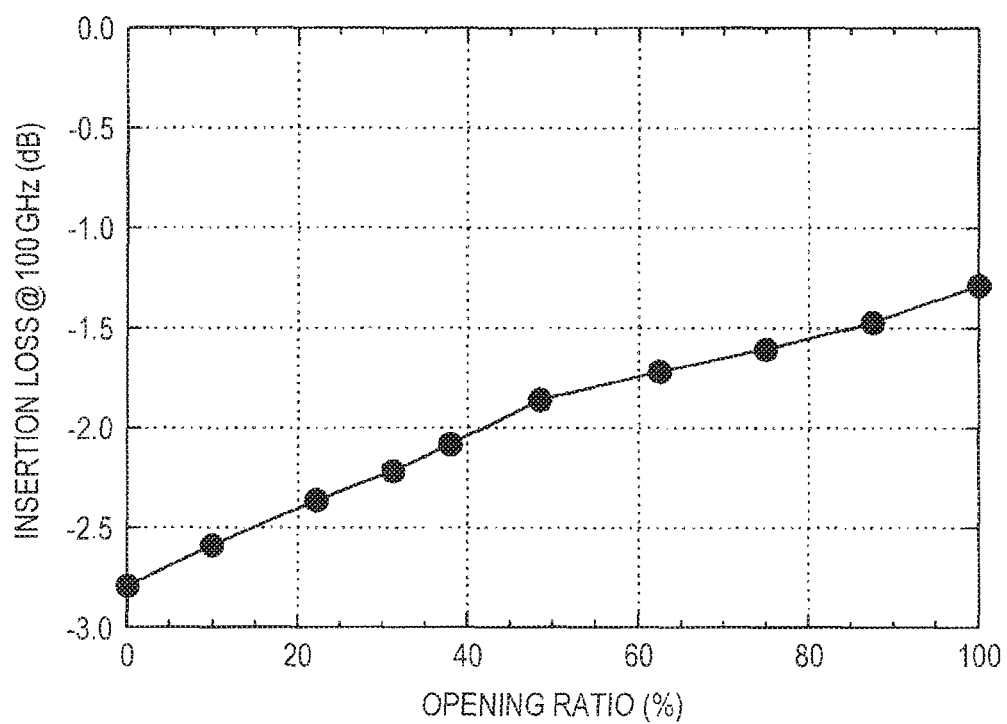
FIG. 20 is a graph showing a relationship between an opening ratio and an insertion loss.

As illustrated in FIG. 19, when seen in plan view, the grounding back surface pattern GBP1 is formed with an opening region (opening pattern) which communicates with the cutout portion and partly surrounds the back surface terminal BT. At this time, in FIG. 19, the width of the cutout portion in a y direction crossing the x direction is defined to be "W1", and the maximum width of the opening region (opening pattern) in the y direction is defined to be "W2". In this case, it is desirable that "W1/W2" as an opening ratio is 40% or more in terms of the insertion loss of the high frequency signal (electromagnetic wave) being reduced. Specifically, FIG. 20 is a graph showing a relationship between the opening ratio and the insertion loss. In FIG. 20, the horizontal axis indicates an opening ratio (%), and the vertical axis indicates an insertion loss at 100 GHz. It is understood that when the opening ratio becomes 40% or more as illustrated in FIG. 20, the insertion loss becomes smaller than −2.0 dB. Thus, it is understood that it is possible to suppress degradation in the signal transmission characteristics by setting the opening ratio to be 40% or more.

Subsequently, a further feature point in the present embodiment 2 resides in that as illustrated in FIG. 13, for example, the grounding surface pattern GSP1 is coupled to the through holes TH2, and these through holes TH2 are arranged so as to surround the back surface terminal BT discretely. Thus, according to the present embodiment 2, it is possible to obtain an advantage for the low frequency signal and an advantage for the high frequency signal.

First, when paying attention to the low frequency signal, the diffusion of the electric field which configures the electromagnetic wave is suppressed by providing a plurality of through holes as illustrated in FIG. 4, for example. This means that a leakage loss of the low frequency signal is suppressed. Thus, it is possible to achieve an improvement in the signal transmission characteristics of the low frequency signal.

Subsequently, attention is paid to the high frequency signal. In this case, the high frequency signal is propagated along the mutually overlapping portions (side surfaces) of the back surface terminal BT and the grounding surface pattern GSP1 by the guided "horizontal transmission mode" (refer to FIG. 13). At this time, since the high frequency signal becomes short in wavelength, a potential distribution occurs within the plane of the grounding surface pattern GSP1, i.e., within an x-y plane when the high frequency signal is propagated along the side surface of the opening region of the grounding surface pattern GSP1. Thus, the component of the "vertical transmission mode" orthogonal to the intended "horizontal transmission mode" is generated, so that the transmission efficiency of the "horizontal transmission mode" is degraded. As for this point, it is useful to couple the plural through holes TH2 to the grounding surface pattern GSP1 as illustrated in FIG. 13. This is because since the coupling region of the grounding surface pattern GSP1 and the through holes TH2 is forcibly fixed to 0V, the potential difference can be suppressed from occurring within the plane of the grounding surface pattern GSP1 by narrowing the interval between the through holes TH2. Thus, according to the further feature point in the present embodiment 2, it is possible to obtain an advantage of enabling the signal transmission characteristics of the high frequency signal to be improved even when attention is paid to the high frequency signal.

As described above, the further feature point in the present embodiment 2 has a technical significance that it contributes to the improvement in the signal transmission characteristics in both the low and high frequency signals.

<Modification>

Figure 21:
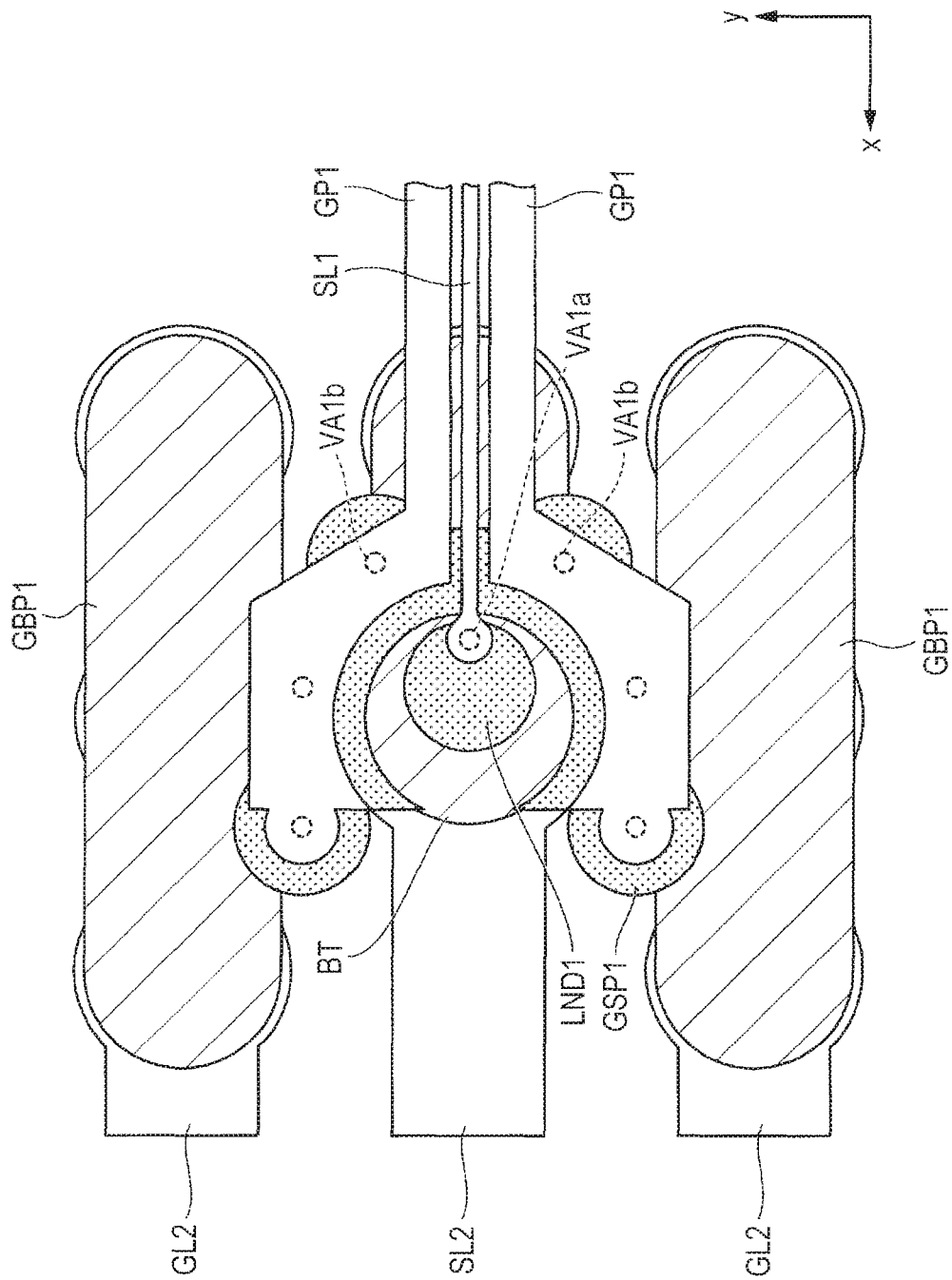
FIG. 21 is a plan diagram showing wiring patterns formed over a mounting board and conductor patterns formed in each wiring layer of a wiring board having a multi-layer wiring layer in an overlapped form on a planar basis in a modification.

A description will next be made about a modification of the present embodiment 2. FIG. 21 is a plan diagram showing wiring patterns formed over a mounting board and conductor patterns formed in each wiring layer of a wiring board having a multi-layer wiring layer in an overlapped form on a planar basis in the modification. On the other hand, FIG. 22 is a diagram corresponding to FIG. 21 and a diagram showing, in an abbreviated form, conductor patterns respectively formed in a core layer and a first build-up layer above a second build-up layer.

Figure 22:
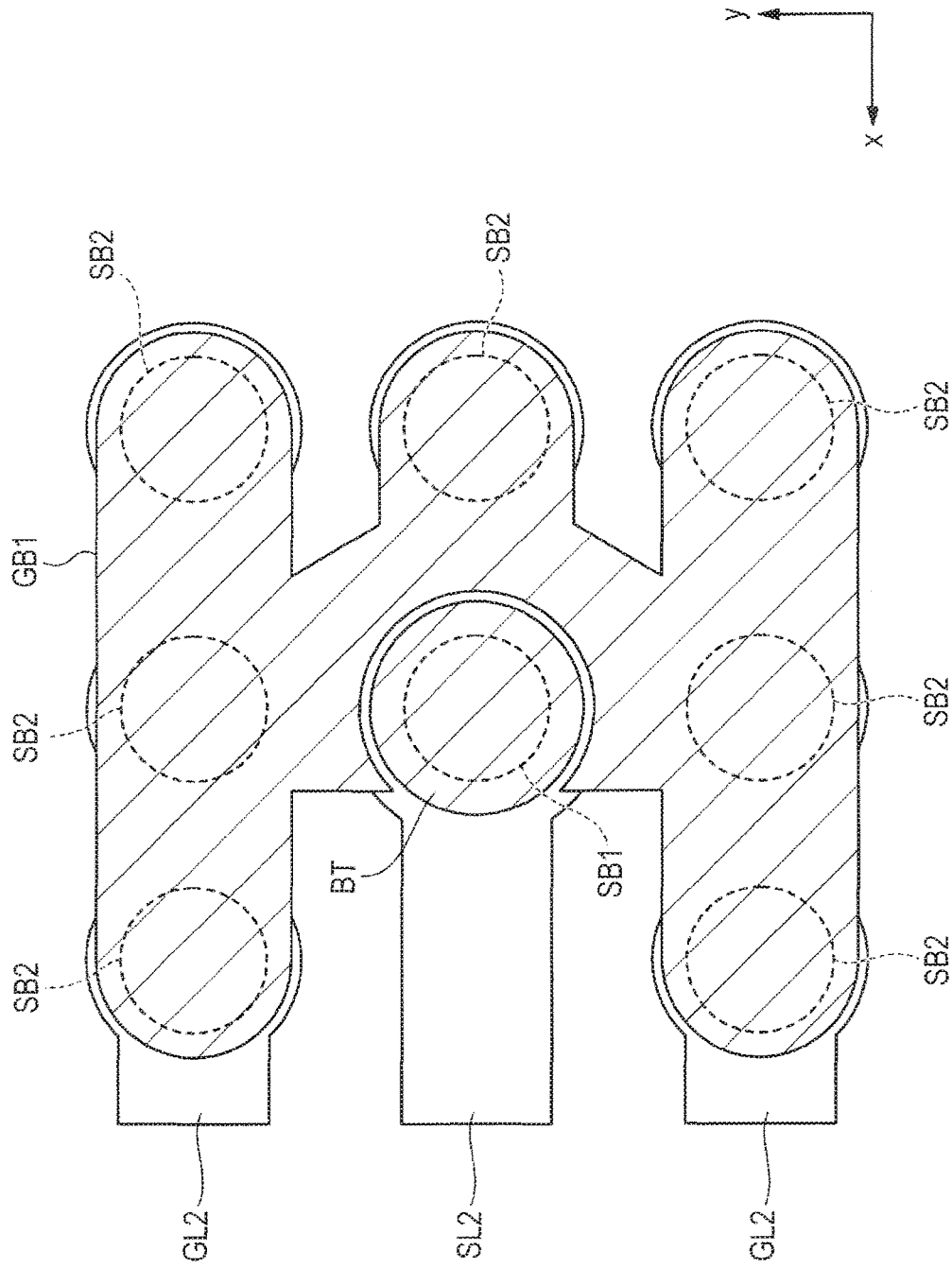
FIG. 22 is a diagram corresponding to FIG. 21 and a diagram, in an abbreviated form, conductor patterns respectively formed in a core layer and a first build-up layer above a second build-up layer.

In FIG. 22, in the present modification, solder balls SB2 each supplied with a ground potential are arranged in an outward direction (+x direction) of a solder ball SB1. Thus, it is possible to suppress crosstalk between signals. That is, in an actual product although not illustrated in FIG. 22, a plurality of signal wirings SL2 are arranged in the mounting board so as to adjoin each other with the combination of the signal wiring SL2 and ground wirings GL2 as a unit. Thus, there is a fear that when the signal wirings SL2 are arranged close to each other, crosstalk is manifested between the signal wirings SL2. As for this point, in the present modification, the solder balls SB2 each supplied with the ground potential are added in the outward direction (+x direction) of the solder ball SB1 as illustrated in FIG. 22. Thus, according to the present modification, the solder balls SB2 each supplied with the ground potential enables a shield effect to be enhanced. As a result, according to the present modification, it is possible to reduce the crosstalk between the signal wirings SL2. Thus, according to the present modification, it is possible to enhance the performance of a semiconductor device.

Embodiment 3

<Considerations for Improvement (Adverse Effects)>

When the low frequency signal (e.g., signal of the frequency smaller than 80 GHz) having the wavelength sufficiently longer than the depths of the via structures VS1 and VS2 is transmitted, the potential difference does not occur inside the via structure VS2 supplied with the ground potential as illustrated in FIG. 5, for example, so that no leakage electromagnetic wave is generated. From this, when the low frequency signal is transmitted, the signal transmission characteristics can be sufficiently enhanced by the measure of providing the via structures VS2 each supplied with the ground potential around the via structure VS1 even if the advancing direction of the low frequency signal in the via structure VS1 is made to assume the depth direction of the via structure VS1 as illustrated in FIGS. 3 and 4, for example.

That is, when the low frequency signal having the wavelength sufficiently longer than the depths of the via structures VS1 and VS2 is transmitted, there is no necessity for the advancing direction of the low frequency signal in the via structure VS1 to be set to the direction perpendicular to the depth direction of the via structure and parallel to the advancing direction of the low frequency in the signal wiring coupled to the via structure. Adversely, the signal transmission characteristics are degraded. This point will be described below.

The characteristic impedance of the via structure VS1 being of the discontinuous structural body is made to match with the characteristic impedance of the first wiring structure (signal wiring SL1+ground wiring GL1) on the assumption that the signal is transmitted through the via structure VS1 in the "vertical transmission mode". As for this point, when the first and second feature points in the embodiment 1 describe above are adopted, the "horizontal transmission mode" is guided. That is, when the first and second feature points in the embodiment 1 are adopted even where the low frequency signal is propagated through the via structure VS1, the "horizontal transmission mode" is also included in the low frequency signal propagated through the via structure VS1 together with the "vertical transmission mode". Here, the characteristic impedance varies between the "vertical transmission mode" and the "horizontal transmission mode". Thus, when the component of the "horizontal transmission mode" is included in the low frequency signal in a state in which impedance matching is done assuming the low frequency signal including only the "vertical transmission mode", the characteristic impedance of the via structure VS1 changes suddenly. As a result, impedance mismatching occurs, and hence the signal transmission characteristics of the low frequency signal are degraded. Further, when the first and second feature points in the embodiment 1 are adopted, the via structure VS1 and the via structure VS2 supplied with the ground potential have their overlapping portions, thus resulting in an increase in parasitic capacity. Further, the parasitic capacity changes the characteristic impedance of the via structure VS1. That is, the adoption of the first and second feature points in the embodiment 1 will cause an adverse effect of degrading the signal transmission characteristics of the low frequency signal by the synergistic factors of the point that the "horizontal transmission mode" is added to the low frequency signal and the point that the parasitic capacity increases, where the low frequency signal is propagated through the via structure VS1. Thus, the present embodiment 3 applies devising for suppressing the adverse effect of degradation in the signal transmission characteristics of the low frequency signal, which is induced by the adoption of the first and second feature points in the embodiment 1 while improving the signal transmission characteristics of the high frequency signal, by adopting the first and second feature points in the embodiment 1. This devising point will be described below.

<Planar Layout Configuration>

Figure 23:
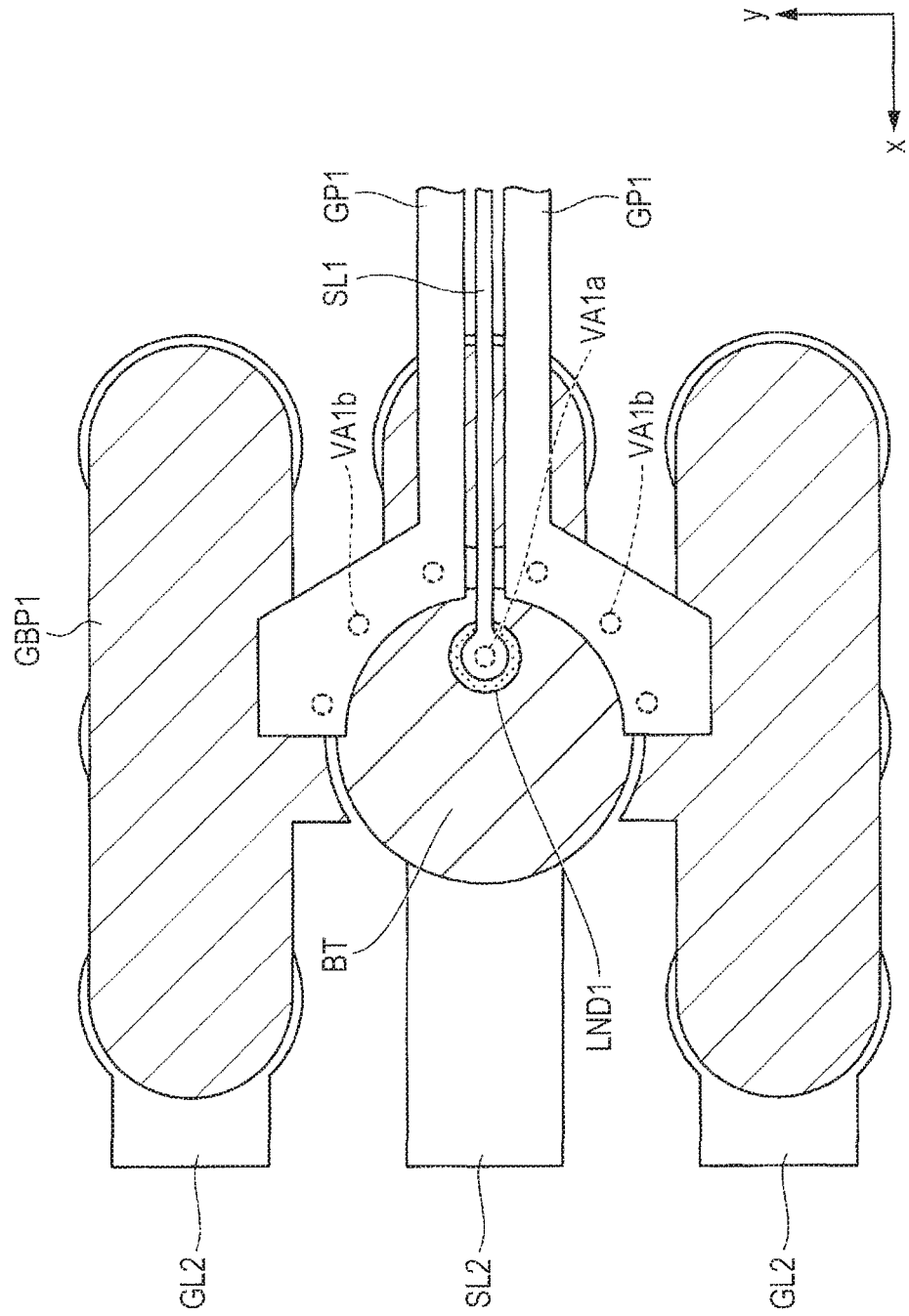
FIG. 23 is a plan diagram showing wiring patterns formed over a mounting board and conductor patterns formed in each wiring layer of a wiring board having a multi-layer wiring layer in an overlapped form on a planar basis.

FIG. 23 is a plan diagram showing wiring patterns formed over a mounting board and conductor patterns formed in each wiring layer of a wiring board having a multi-layer wiring layer in an overlapped form on a planar basis. In FIG. 23, the wiring board has a core layer, a first build-up layer formed over the surface of the core layer, and a second build-up layer formed below the back surface of the core layer. First, in FIG. 23, a signal wiring SL1 extending in an x direction and a ground pattern GP1 arranged around the signal wiring SL1 are formed at the surface of the first build-up layer of the wiring board. Further, as illustrated in FIG. 23, the signal wiring SL1 is coupled through a via VA1a to a land LND1 formed at the surface of the core layer of the wiring board. Also, the ground pattern GP1 is coupled through a plurality of vias VA1b to a grounding-surface pattern (not illustrated in FIG. 23) formed at the surface of the core layer of the wiring board.

Figure 24:
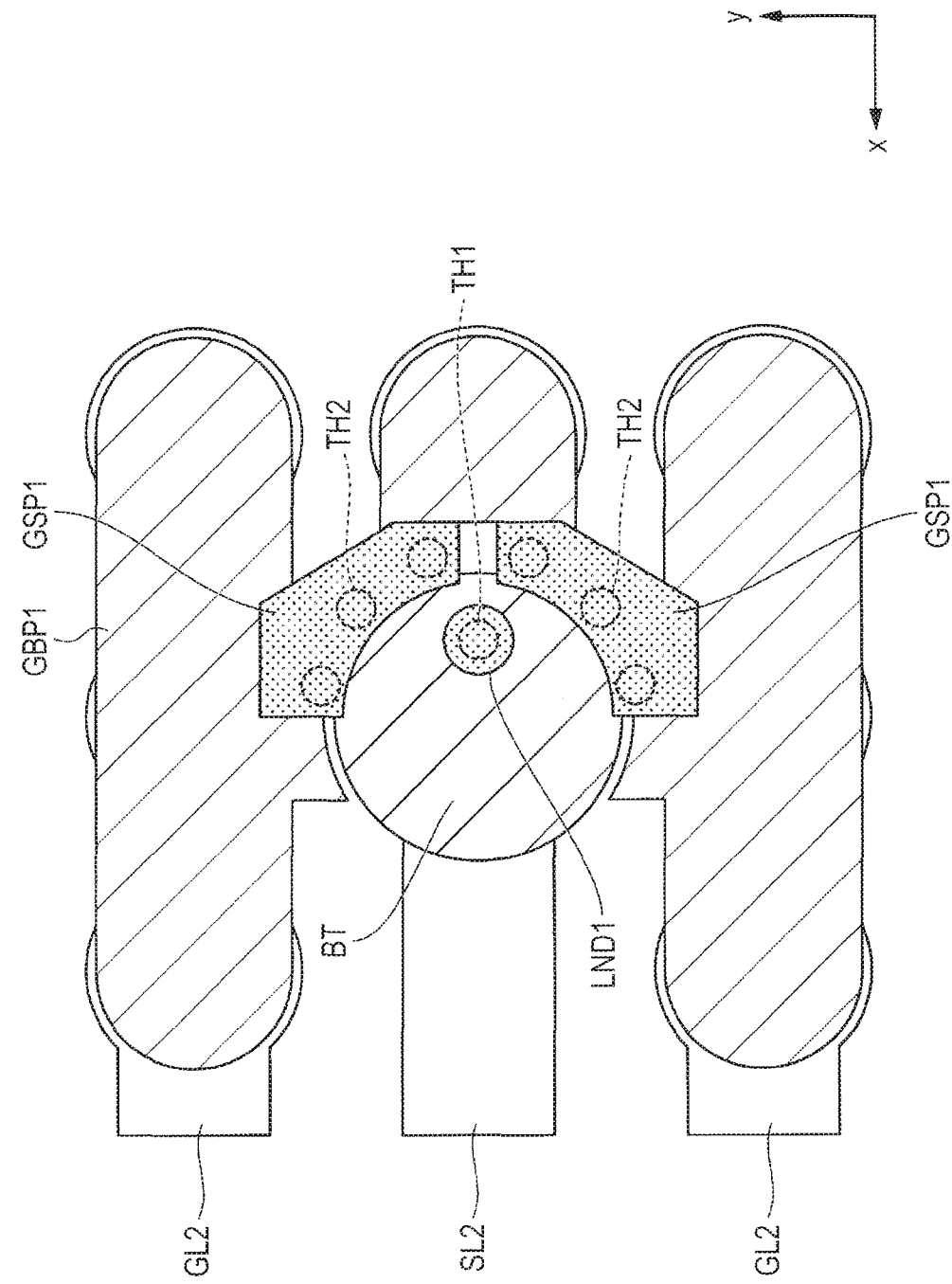
FIG. 24 is a diagram showing the surface of a core layer in an omitted form of a signal wiring and a ground pattern formed at the surface of the first build-up layer.

Next, FIG. 24 is a diagram illustrating the surface of the core layer in an omitted form of the signal wiring SL1 and the ground pattern GP1 formed at the surface of the first build-up layer. In FIG. 24, the land LND1 and the grounding surface pattern GSP1 disposed in the neighborhood of the land LND1 are formed at the surface of the core layer. At this time, as illustrated in FIG. 24, the land LND1 is coupled to a through hole TH1 penetrating the core layer. Further, the grounding surface pattern GSP1 is coupled to a plurality of through holes TH2.

<Devising Points in Embodiment 3>

Devising points in the present embodiment 3 will next be described. First, the first devising point in the present embodiment 3 resides in that as understood by comparison of FIGS. 13 and 24, the planar size of each through hole TH2 is made small, and the pitch at which the through holes TH2 are arranged is made narrow. Thus, the through hole TH2 supplied with the ground potential can be made close to the through hole TH1 through which the high frequency signal is propagated, and the gap between the through holes TH2 can be reduced. As a result, according to the present embodiment 3, it is possible to densely dispose the through holes TH2 each supplied with the ground potential. Therefore, according to the present embodiment 3, when the low frequency signal is propagated through the through hole TH1, it is possible to enhance a shield effect by the through holes TH2 and the effect of reducing a diffusion space of an electromagnetic wave, whereby, for example, the diffusion of electromagnetic waves indicated by wavy line in FIG. 4 is effectively suppressed. Thus, according to the first devising point in the present embodiment 3, it is possible to suppress the loss of the low frequency signal due to the diffusion of the electromagnetic waves and suppress degradation in the signal transmission characteristics of the low frequency signal.

Subsequently, the second devising point in the present embodiment 3 resides in that as understood by comparison of FIGS. 13 and 24, the planar size of the grounding surface pattern GSP1 is reduced. Thus, according to the present embodiment 3, it is possible to suppress the generation of a parasitic capacity. This means that it is possible to reduce a deviation in characteristic impedance due to the parasitic capacity. Thus, according to the second devising point in the present embodiment 3, it is possible to suppress the loss of the low frequency signal due to impedance mismatching and suppress degradation in the signal transmission characteristics of the low frequency signal.

On the other hand, the third devising point in the present embodiment 3 resides in that the thickness of the core layer configuring the wiring board is thinned to such an extent that inconvenience caused by thinning is not manifested. The present third devising point is a devising point which is different from the first and second devising points for enhancing the signal transmission characteristics of the low frequency signal and is for enhancing the signal transmission characteristics of the high frequency signal. Specifically, one example of the third devising point can illustrate that the thickness of the core layer is thinned to be from about 400 µm to about 200 µm. Thus, since an electric field component vibrated in the z direction, which is necessary for the "horizontal transmission mode", can be increased by thinning of the thickness of the core layer, it is possible to enhance the signal transmission characteristics of the high frequency signal.

From the above, in the present embodiment 3, the signal transmission characteristics to the low frequency signal can be improved while maintaining the signal transmission characteristics to the high frequency signal by combining the first, second and third devising points described above.

Figure 25:
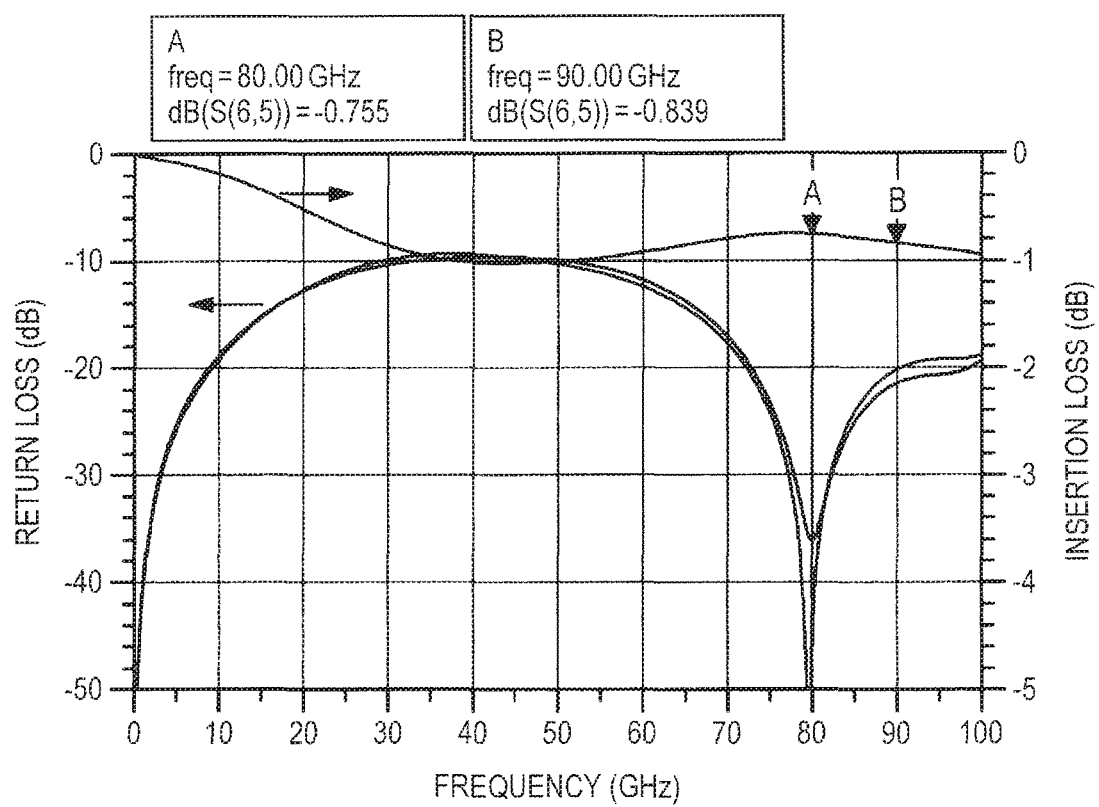
FIG. 25 is a graph showing a relationship between the frequency of a signal and a return loss thereof, and a relationship between the frequency of a signal and an insertion loss thereof.

FIG. 25 is a graph showing a relationship between the frequency of a signal and a return loss thereof, and a relationship between the frequency of a signal and an insertion loss thereof where a package structure in the present embodiment 3 is adopted. In FIG. 25, the horizontal axis indicates the frequency (GHz) of the signal. On the other hand, the vertical axis (left side) indicates the return loss (dB), and the vertical axis (right side) indicates the insertion loss (dB). When the frequency of a signal indicated at a point A is 80 GHz in FIG. 25, the insertion loss becomes −0.755 dB, and the return loss becomes −30 dB or less. Further, when the frequency of a signal indicated at a point B is 90 GHz in FIG. 25, the insertion loss becomes −0.839 dB, and the return loss becomes −20 dB or less. Thus, according to the present embodiment 3, it is understood that when a signal of 80 GHz or higher is transmitted, the insertion loss can be suppressed to −1 dB or less, and the return loss can be reduced to −20 dB or less as with the embodiment 2. Thus, it is understood from, the result, illustrated in FIG. 25 that according to the present embodiment 3, the signal transmission characteristics of the high frequency signal can be improved to the same extent as the embodiment 1.

Further, it is understood that as known by comparison between FIGS. 18 and 25, both the insertion and return losses of a low frequency signal of approximately 60 GHz or less are improved as compared with the embodiment 2 illustrated in FIG. 18. Thus, it is understood in the present embodiment 3 that the signal transmission characteristics to the low frequency signal can be improved while maintaining the signal transmission characteristics to the high frequency signal by combining the first devising point, second devising point, and third devising point described above.

Incidentally, according to the present embodiment 3, satisfactory signal transmission characteristics are shown in a wide frequency range of 0 Hz to 100 GHz as illustrated in FIG. 25. Therefore, the configuration described in the present embodiment 3 is suitable even for application not only to millimeter-wave band wireless communication narrow in usage frequency range but also to ultra high-speed digital signal transmission which uses a wide frequency band from the vicinity of 0 Hz. It is considered that when the configuration in the present embodiment 3 is applied to the digital signal transmission because at least low loss transmission up to 100 GHz is held in FIG. 25, for example, signal transmission is made possible at a speed of 200 Gbps in the case of binary modulation, and signal transmission is made possible at a speed of 400 Gbps in the case of quaternary modulation.

Embodiment 4

<Planar Layout Configuration>

Figure 26:
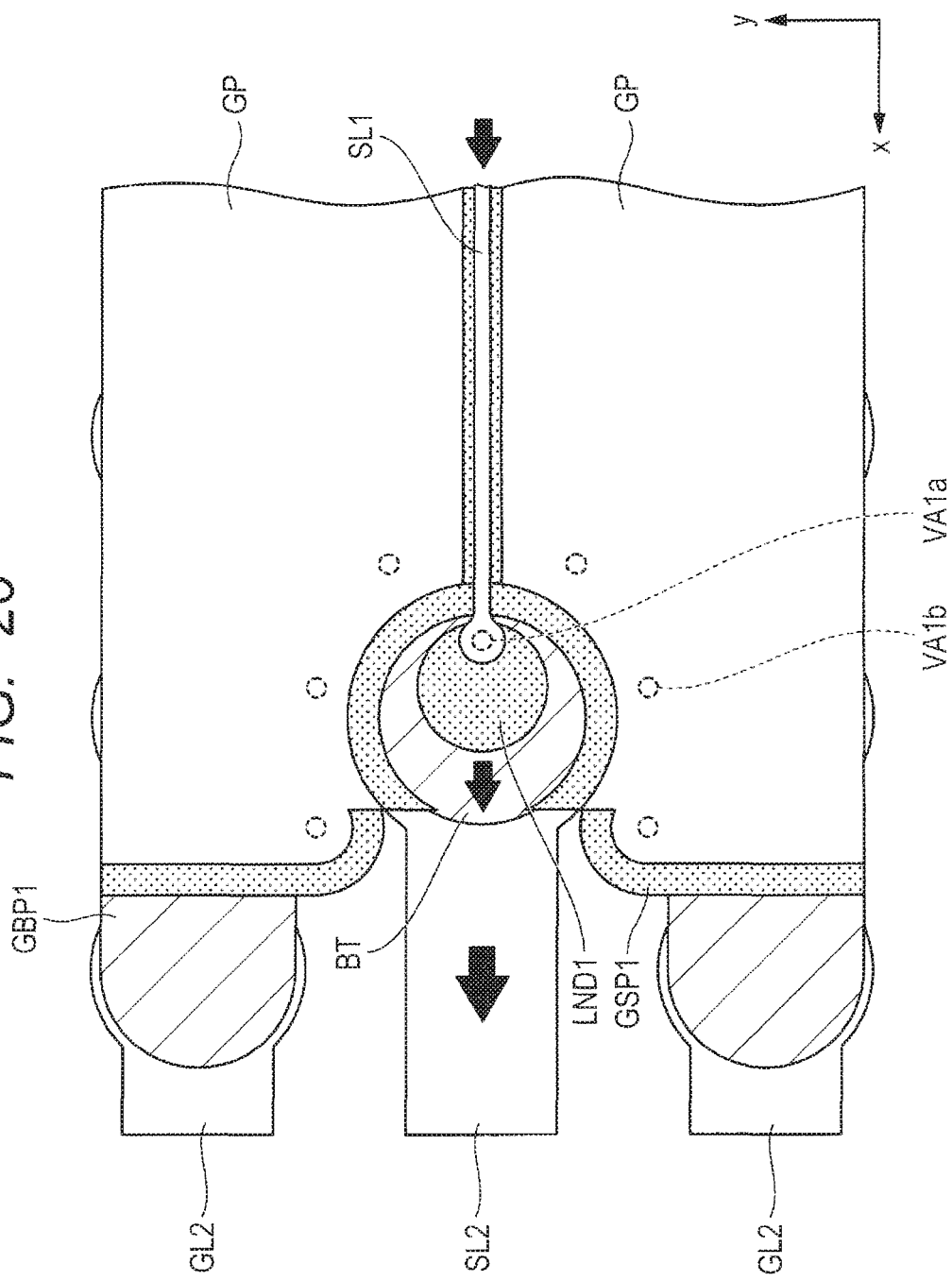
FIG. 26 is a plan diagram showing wiring patterns formed over a mounting board and conductor patterns formed in each wiring layer of a wiring board having a multi-layer wiring layer in an overlapped form on a planar basis.

FIG. 26 is a plan diagram showing wiring patterns formed over a mounting board and conductor patterns formed in each wiring layer of a wiring board having a multi-layer wiring layer in an overlapped form on a planar basis. In FIG. 26, the wiring board has a core layer, a first build-up layer formed over the surface of the core layer, and a second build-up layer formed below the back surface of the core layer. First, in FIG. 26, a signal wiring SL1 extending in an x direction and a large-area ground pattern GP arranged around the signal wiring SL1 are formed at the surface of the first build-up layer of the wiring board. Then, as illustrated in FIG. 26, the signal wiring SL1 is coupled to a land LND1 formed at the surface of the core layer of the wiring board through a via VA1a. Further, the large-area ground pattern GP is coupled to a grounding surface pattern GSP1 formed at the surface of the core layer of the wiring board through a plurality of vias VA1b.

Figure 27:
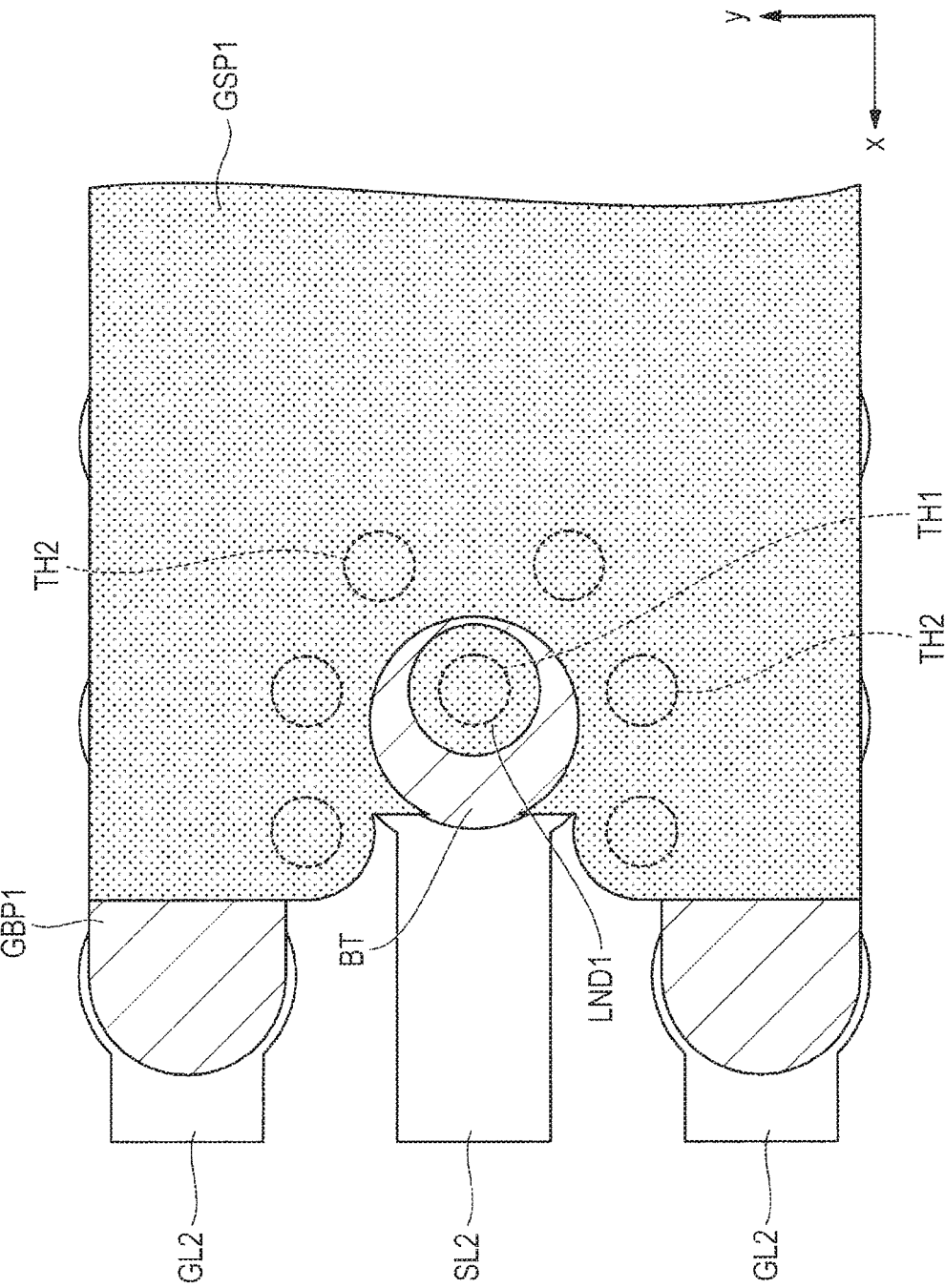
FIG. 27 is a diagram, showing the surface of a core layer in an omitted form of a signal wiring and a ground pattern formed at the surface of a first build-up layer.

Next, FIG. 27 is a diagram showing the surface of the core layer in an omitted form, of the signal wiring SL1 and the ground pattern GP formed at the surface of the first build-up layer. In FIG. 27, the land LND1 and the large-area grounding surface pattern GSP1 arranged around the land LND1 are formed at the surface of the core layer. At this time, as illustrated in FIG. 27, the land LND1 is coupled to a through hole TH1 penetrating the core layer. Further, the large-area grounding surface pattern GSP1 is coupled to a plurality of through holes TH2.

Figure 28:
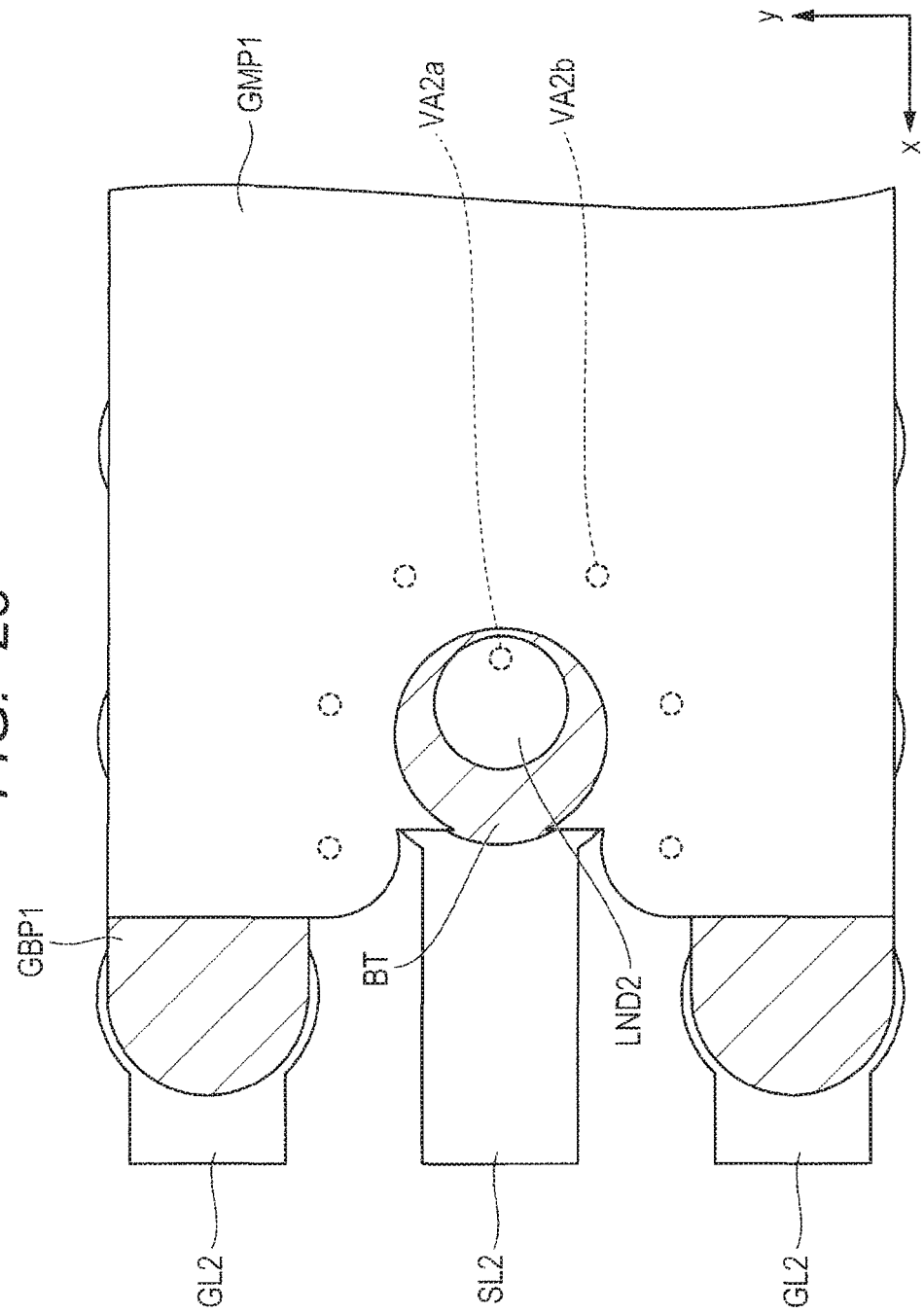
FIG. 28 is a diagram showing the back surface of the core layer in an omitted form of a land and a large-area grounding surface pattern formed at the surface of the core layer.

Subsequently, FIG. 28 is a diagram showing the back surface of the core layer in an omitted form of the land LND1 and the large-area grounding surface pattern GSP1 formed at the surface of the core layer. In FIG. 28, a land LND2 and a large-area grounding middle pattern GMP1 arranged around the land LND2 are formed at the back surface of the core layer. At this time, the land LND2 illustrated in FIG. 28 is coupled to the land LND1 illustrated in FIG. 27 by the through hole TH1. On the other hand, the grounding middle pattern GMP1 illustrated in FIG. 28 is coupled to the grounding surface pattern GSP1 illustrated in FIG. 27 by the plural through holes TH2. Further, the land LND2 illustrated in FIG. 28 is coupled to a back surface terminal BT through a via VA2a. Also, the grounding middle pattern GMP1 illustrated in FIG. 28 is coupled to a grounding back surface pattern GBP1 through a plurality of vias VA2b.

Figure 29:
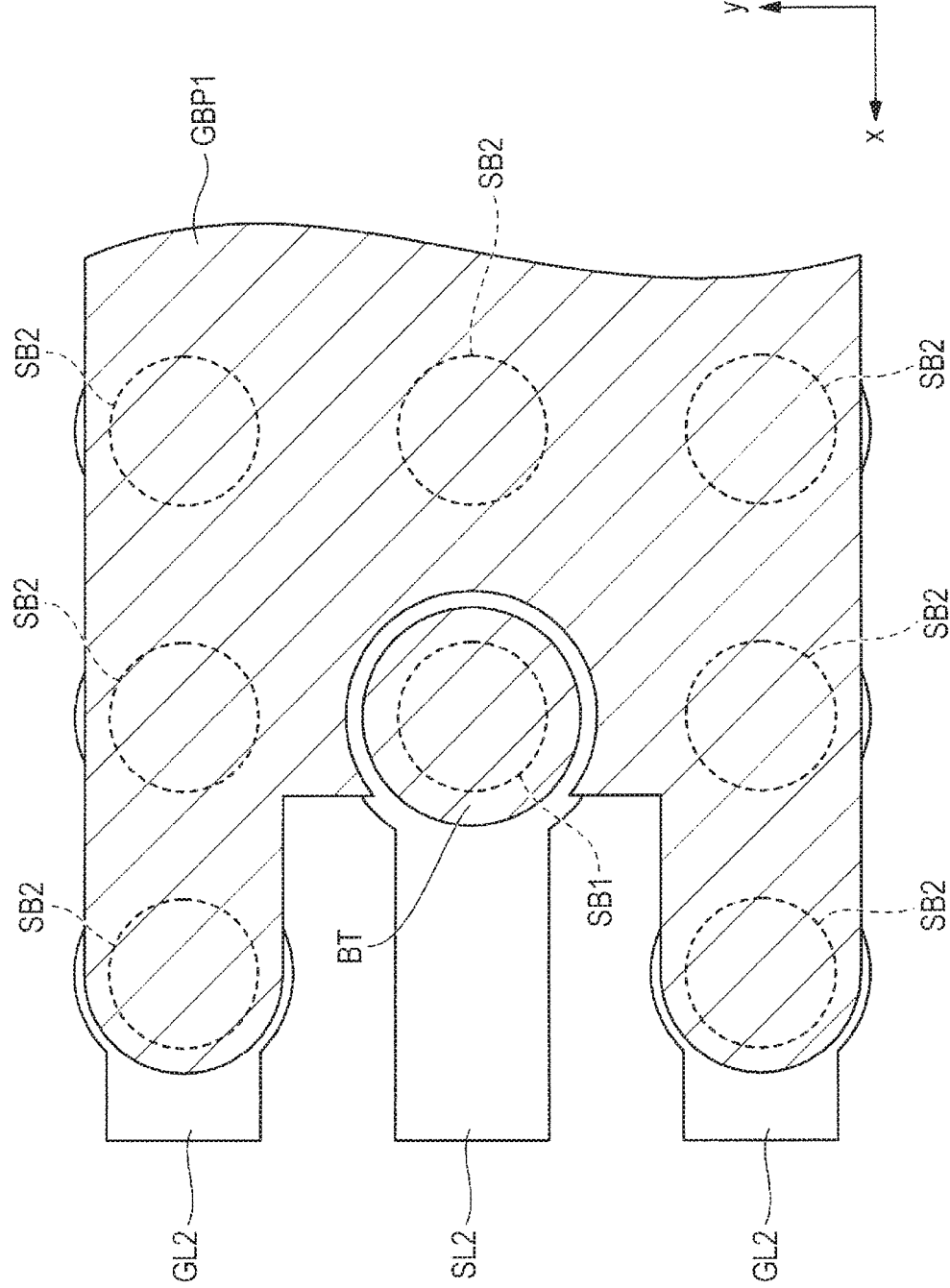
FIG. 29 is a diagram showing the back surface of a second build-up layer in an omitted form of a land and a grounding middle pattern formed at the back surface of the core layer.

Next, FIG. 29 is a diagram showing the back surface of the second build-up layer in an omitted form of the land LND2 and the grounding middle pattern GMP1 formed at the back surface of the core layer. In FIG. 29, the back surface terminal BT and the grounding back surface pattern GBP1 arranged around the back surface terminal BT are formed at the back surface of the second build-up layer. Then, the back surface terminal BT is partly surrounded by the grounding back surface pattern GBP1 in plan view. Further, the back surface terminal BT illustrated in FIG. 29 is coupled to a solder ball SB1. Likewise, the grounding back surface pattern GBP1 illustrated in FIG. 29 is coupled to a plurality of solder balls SB2.

Even in such a planar layout configuration in the present embodiment 4, the technical idea in the embodiment 1 can be embodied. That is, the technical idea in the embodiment 1 can be applied even when the large-area grounding surface pattern GSP1 is used.

Embodiment 5

The present embodiment 5 will describe an example in which the technical idea in the embodiment 1 is applied to a Wafer level Package which has recently been active in development. In a semiconductor device in the present embodiment 5, a Re-distribution wiring whose thickness is a few μm is formed at the surface of a semiconductor chip. The Re-distribution wiring is coupled via a solder ball to its corresponding wiring formed at the surface of a mounting board.

Figure 30:
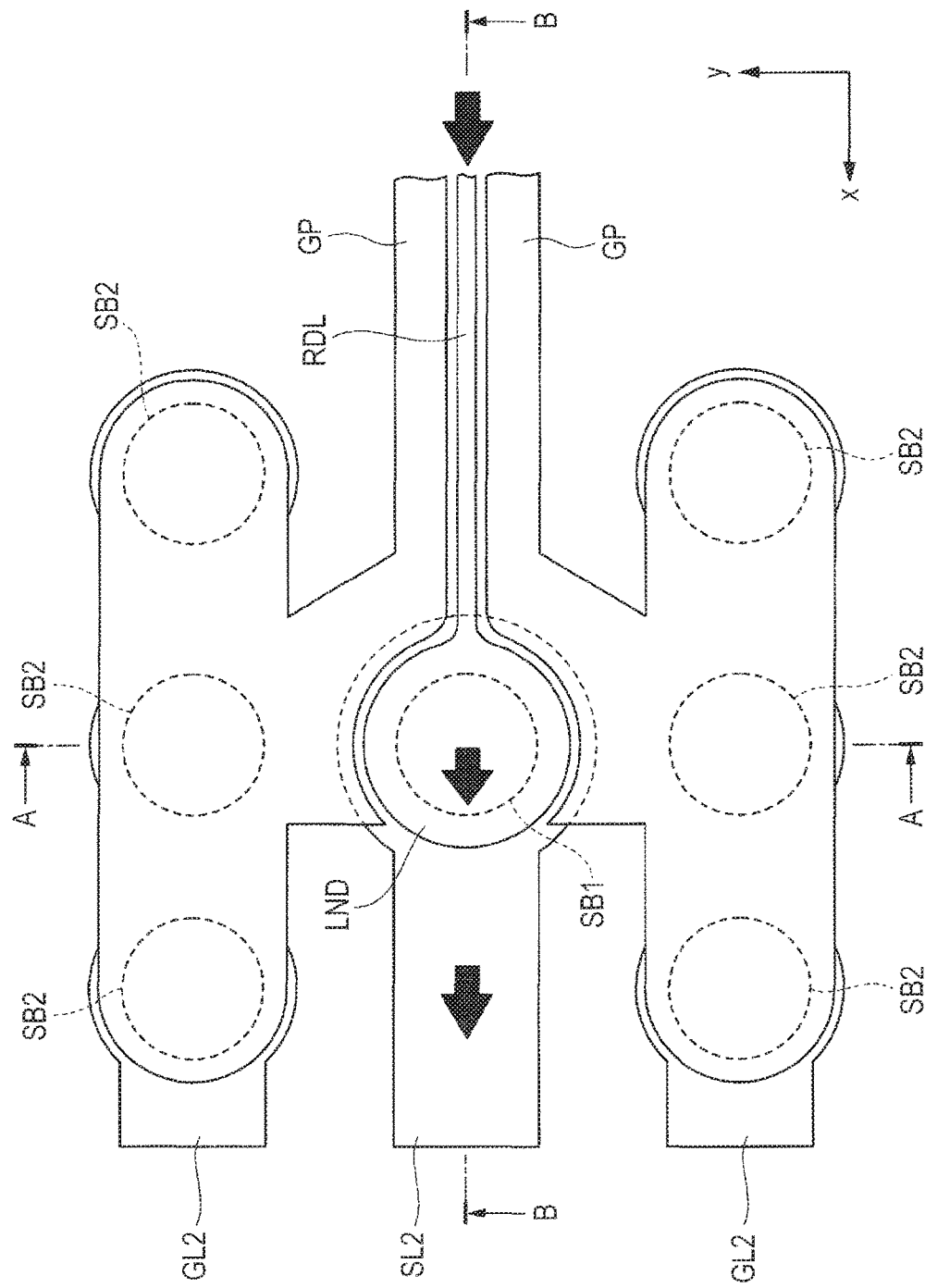
FIG. 30 is a typical diagram showing a planar layout of a coupling structure of a re-distribution wiring formed at the surface of a semiconductor chip and a wiring formed at the surface of a mounting board.

FIG. 30 is a typical diagram showing a planar layout of a coupling structure of a Re-distribution wiring formed at the surface of a semiconductor chip and a wiring formed at the surface of a mounting board. In FIG. 30, the Re-distribution wiring RDL extends in an x direction, and an end of the Re-distribution wiring RDL extending in the x direction is coupled to a land LND, On the other hand, a ground pattern GP is formed around the Re-distribution wiring RDL. The ground pattern GP partly surrounds the land LND. Then, as illustrated in FIG. 30, the land LND is coupled via a solder ball SB1 to a signal wiring SL2 formed at the surface of the mounting board. On the other hand, the ground pattern GP is coupled via a plurality of solder balls SB2 to its corresponding ground wiring GL2 formed at the surface of the mounting board. At this time, in the present embodiment 5, as illustrated in FIG. 30, the ground pattern GP formed at the surface of the semiconductor chip and the signal wiring SL2 formed at the surface of the mounting board are formed so as to have portions superimposed on a planar basis. Thus, the technical idea in the embodiment 1 is embodied even in the present embodiment 5. As a result, it is possible to improve the signal transmission characteristics of a high frequency signal of, for example, 80 GHz or higher even in the present embodiment 5.

Figure 31:
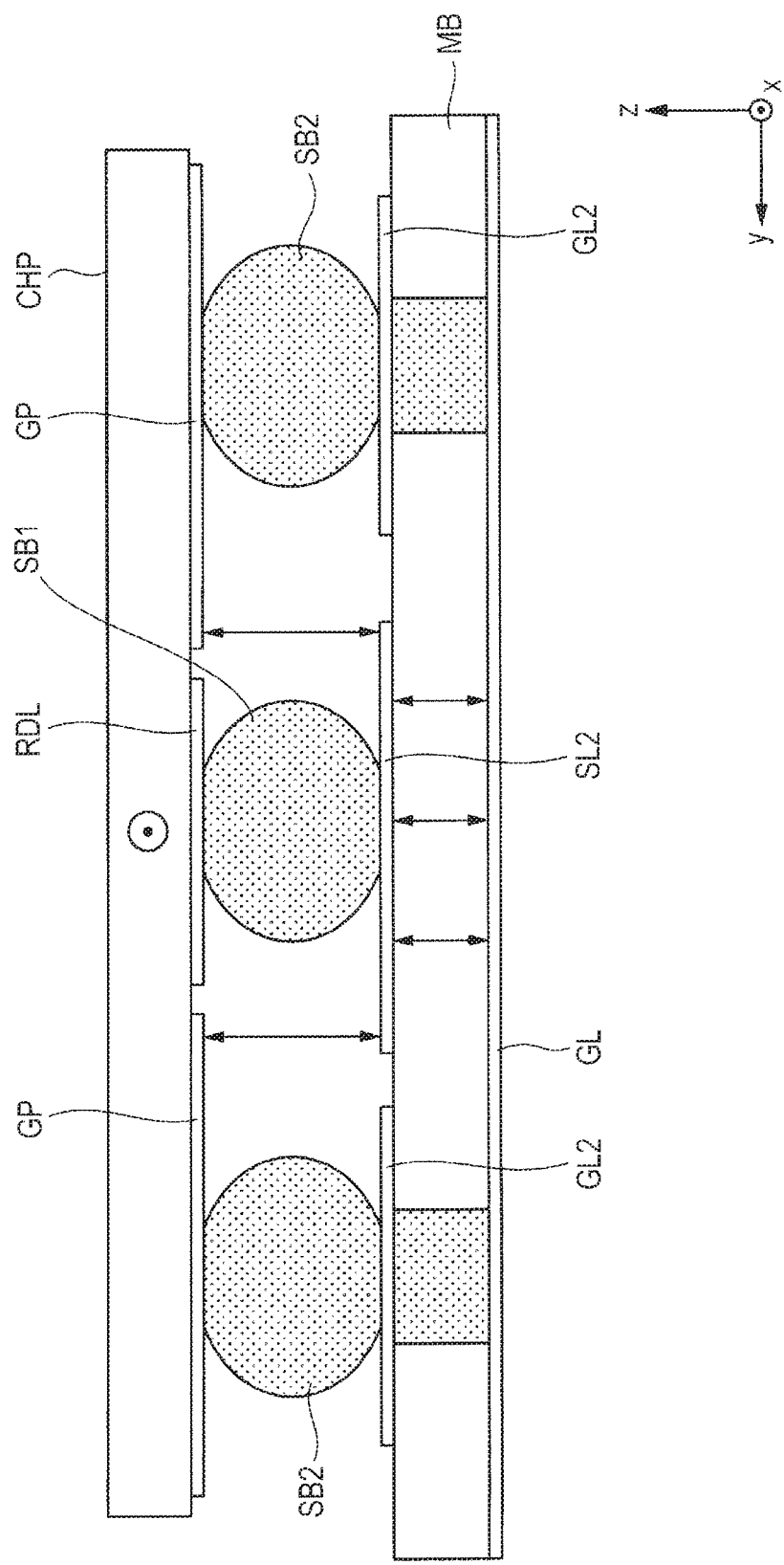
FIG. 31 is a sectional diagram cut along line A-A of FIG. 30.

FIG. 31 is a sectional diagram cut along line A-A of FIG. 30. It is understood in FIG. 31 that the Re-distribution wiring PDL formed at the surface (lower surface) of the semiconductor chip CHP is coupled via the solder ball SB1 to the signal wiring SL2 formed at the surface (upper surface) of the mounting board MB. Further, since the ground pattern GP formed at the surface of the semiconductor chip CHP and the signal wiring SL2 formed at the surface of the mounting board MB have their overlapping portions in FIG. 31, a high frequency signal propagated through the solder ball SB1 is guided to propagate through the solder ball SB1 in a "horizontal transmission mode". As a result, since the technical idea in the embodiment 1 is embodied, it is possible to enhance the signal transmission characteristics of a high frequency signal of 80 GHz or higher.

Figure 32:
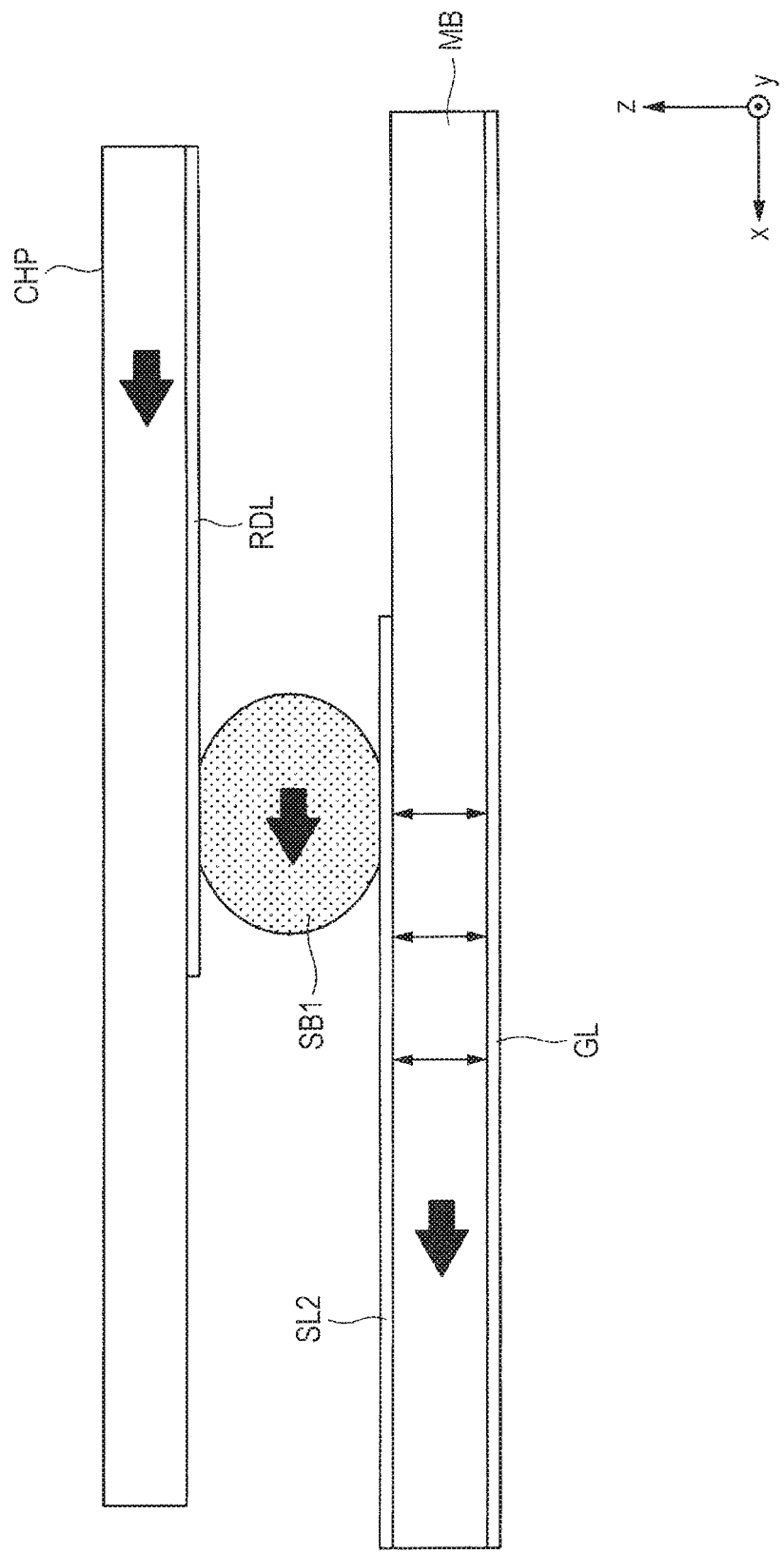
FIG. 32 is a sectional diagram cut along line B-B of FIG. 30.

Likewise, FIG. 32 is a sectional diagram cut along line B-B of FIG. 30. It is understood in FIG. 32 that the Re-distribution wiring RDL formed at the surface (lower surface) of the semiconductor chip CHP is coupled via the solder ball SB1 to the signal wiring SL2 formed at the surface (upper surface) of the mounting board MB. Then, as illustrated in FIG. 32, the advancing direction of a high frequency signal remains unchanged in a transmission path from the Re-distribution wiring RDL formed at the surface of the semiconductor chip CHP to the signal wiring SL2 formed over the mounting board MB through the solder ball SB1 (protrusion electrode, external coupling terminal)(refer to thick arrows). This means that even in the present embodiment 5, the advancing direction of the high frequency signal is not bent in the transmission path from the Re-distribution wiring RDL formed at the surface of the semiconductor chip CHP to the signal wiring SL2 formed over the mounting board MB through the solder ball SB1. That is, even in the present embodiment 5, the solder ball SB1 looks like disappeared geometrically where the electrical propagation of the high frequency signal is considered even if the solder ball SB1 is present. That is, when the electrical propagation of the high frequency signal is considered even in the present embodiment 5, the transmission path from the Re-distribution wiring RDL formed at the surface of the semiconductor chip CHP to the signal wiring SL2 formed over the mounting board MB through the solder ball SB1 can be treated as if it were a single wiring in which the Re-distribution wiring RDL formed at the surface of the semiconductor chip CHP and the signal wiring SL2 formed over the mounting board MB are made to be continuous. As a result, according to the present embodiment 5, it is possible to suppress degradation in the signal transmission characteristics of the high frequency signal due to the solder ball SB1. In other words, according to the present embodiment 5, even if the solder ball SB1 exists in the transmission path for the high frequency signal, the transmission path becomes hard to be adversely affected by the solder ball SB1, so that the signal transmission characteristics of the high frequency signal can be enhanced.

Figure 33:
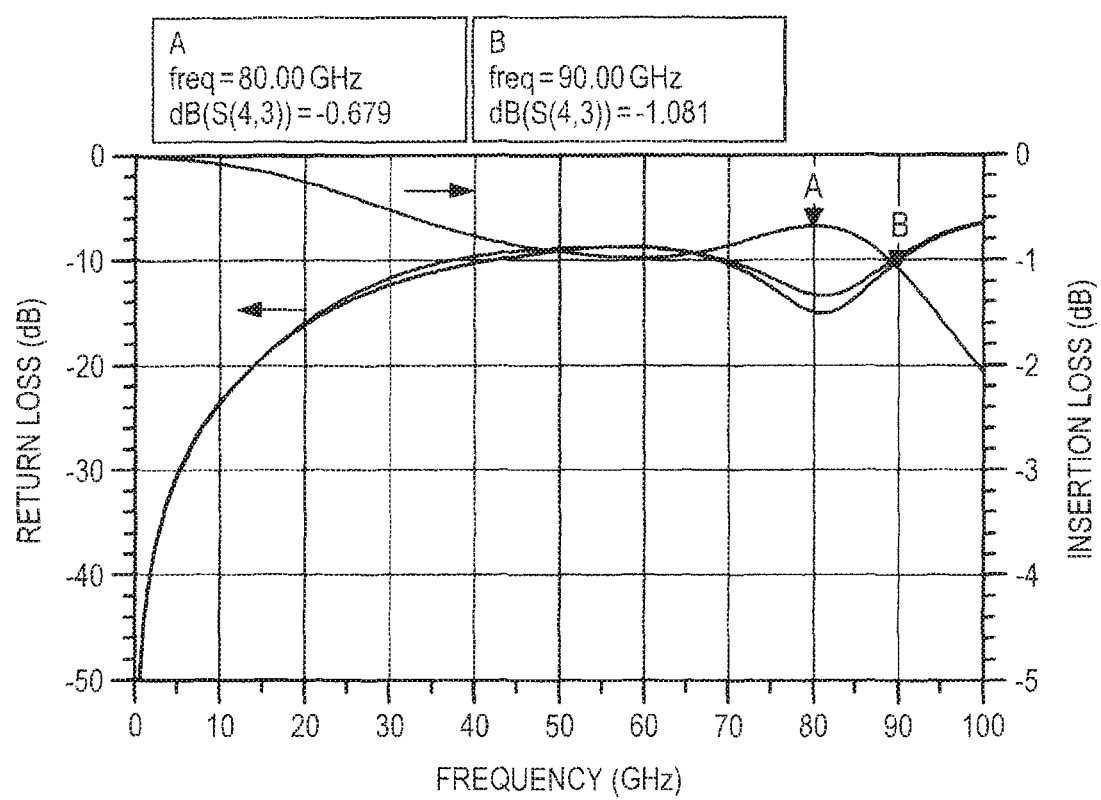
FIG. 33 is a graph showing signal transmission characteristics in a wafer level package structure in a related art.

FIG. 33 is a graph showing signal transmission characteristics in a general wafer level package structure to which the technical idea in the embodiment 1 is not applied. In FIG. 33, the horizontal axis indicates a frequency (GHz). On the other hand, the vertical axis (left side) indicates a return loss (dB), and the vertical axis (right side) indicates an insertion loss (dB). When the frequency of a signal indicated at a point A is 80 GHz in FIG. 33, the insertion loss becomes −0.679 dB, and the return loss becomes −10 dB or less. Further, when the frequency of a signal indicated at a point B is 90 GHz in FIG. 33, the insertion loss becomes −1.081 dB, and the return loss becomes −10 dB or less.

Figure 34:
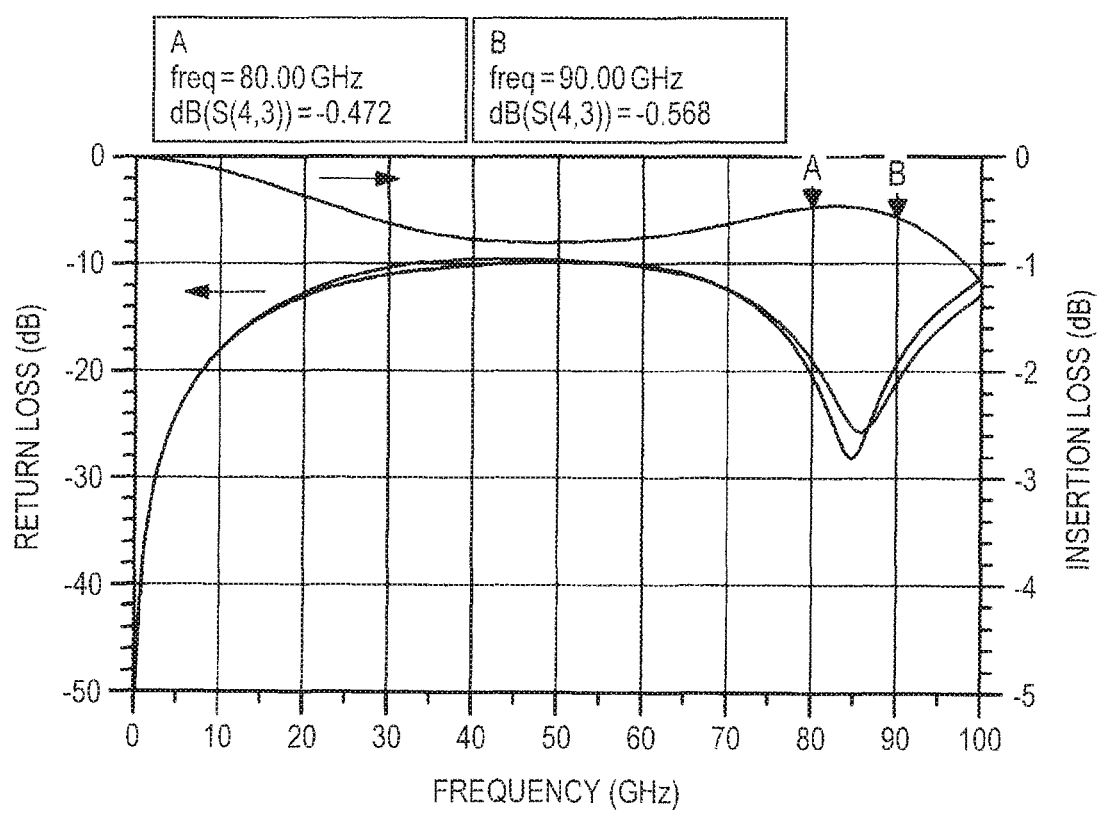
FIG. 34 is a graph showing signal transmission characteristics in a wafer level package structure in an embodiment 5.

In contrast, FIG. 34 is a graph showing signal transmission characteristics in a wafer level package structure (present embodiment 5) to which the technical idea in the embodiment 1 is applied. In FIG. 34, the horizontal axis indicates a frequency (GHz). On the other hand, the vertical axis (left side) indicates a return loss (dB), and the vertical axis (right side) indicates an insertion loss (dB). When the frequency of a signal indicated at a point A is 80 GHz in FIG. 34, the insertion loss becomes −0.472 dB, and the return loss becomes about −20 dB. Further, when the frequency of a signal indicated at a point B is 90 GHz in FIG. 34, the insertion loss becomes −0.568 dB, and the return loss becomes about −20 dB.

It is understood from the above that when the wafer level package structure in the related art illustrated in FIG. 33 and the wafer level package structure in the present embodiment 5 illustrated in FIG. 34 are compared, the high frequency signal of 80 GHz or higher can be reduced in insertion loss and return loss in the present embodiment 5 as compared with the related art. Thus, it is understood that the signal transmission characteristics of the high frequency signal can be improved by applying the technical idea in the embodiment 1 even to the wafer level package structure in the present embodiment 5.

Although the invention made above by the present inventors has been described specifically on the basis of the preferred embodiments, the present invention is not limited to the embodiments referred to above. It is needless to say that various changes can be made to the invention within the scope not departing from the gist thereof.

The above embodiments include the following forms.

(Appendix 1)

A semiconductor device including:

a semiconductor chip, and a wiring board coupled to the semiconductor chip and couplable to a mounting board, in which the wiring board has:

a first wiring structure including a first wiring extending in a first direction, and a via structure including a through via coupled to the first wiring and extending in a second direction orthogonal to the first direction, in which the mounting board has a second wiring structure including a second wiring extending in the first direction and electrically coupled to the through via, and in which the direction in which a first signal of a first frequency propagated over the first wiring structure, the via structure, and the second wiring structure is advanced in the via structure is the first direction.

(Appendix 2)

The semiconductor device described in the appendix 1, in which the direction in which a second signal propagated over the first wiring structure, the via structure, and the second wiring structure and having a second frequency smaller than the first frequency is advanced in the via structure is the second direction.

(Appendix 3)

The semiconductor device described in the appendix 1, in which the first frequency is 80 GHz or higher.

(Appendix 4)

A semiconductor device including a semiconductor chip which is formed at a main surface thereof with a first wiring structure including a first wiring extending in a first direction, and which has a protrusion electrode coupled to the first wiring and protruding in a second direction orthogonal to the first direction and is coupled to a mounting board, in which the mounting board has a second wiring structure including a second wiring extending in the first direction and coupled to the protrusion electrode, and in which the direction in which a first signal of a first frequency propagated over the first wiring structure, the protrusion electrode, and the second wiring structure is advanced through the protrusion electrode is the first direction.

(Appendix 5)

The semiconductor device described in the appendix 4, in which the direction in which a second signal propagated over the first wiring structure, the protrusion electrode, and the second wiring structure and having a second frequency smaller than the first frequency is advanced through the protrusion electrode is the second direction.

(Appendix 6)

The semiconductor device described in the appendix 4, in which the first frequency is 80 GHz or higher.

What is claimed is:

1. A semiconductor device comprising:
a semiconductor chip; and
a wiring board coupled to the semiconductor chip, wherein the wiring board includes:
a signal via structure coupled to a signal line;
a grounding via structure coupled to a ground line;
a first build-up layer equipped with the semiconductor chip;
a core layer positioned in a lower layer of the first build-up layer; and
a second build-up layer positioned in a lower layer of the core layer,
wherein the signal via structure includes:
a surface land formed at a surface of the core layer;
a signal through via coupled to the surface land and penetrating the core layer; and
a back surface terminal electrically coupled to the signal through via and formed at a back surface of the second build-up layer,
wherein the grounding via structure includes:
a grounding surface pattern formed at the surface of the core layer; and
a grounding through via coupled to the grounding surface pattern and penetrating the core layer, and
wherein the back surface terminal and the grounding surface pattern have mutually overlapping portions in a plan view, and
wherein the signal via structure and the grounding via structure have mutually overlapping portions in the plan view.

2. The semiconductor device according to claim 1,
wherein the grounding via structure includes a grounding back surface pattern electrically coupled to the grounding through via and formed at the back surface of the second build-up layer,
wherein the wiring board is coupled to a mounting board equipped with the semiconductor device,
wherein the mounting board has a signal wiring pattern electrically coupled to the signal via structure, and
wherein the grounding back surface pattern and the signal wiring pattern have mutually overlapping portions in the plan view.

3. The semiconductor device according to claim 2, wherein the back surface terminal is partly surrounded by the grounding back surface pattern in the plan view.

4. The semiconductor device according to claim 3,
wherein a first wiring structure electrically coupling the semiconductor chip and the signal via structure is formed at a surface of the first build-up layer, and
wherein in plan view, a cutout portion provided in the grounding back surface pattern exists on an extension in a first direction in which the first wiring structure extends.

5. The semiconductor device according to claim 4,
wherein the grounding back surface pattern is formed with an opening pattern which communicates with the cutout portion and partly surrounds the back surface terminal in the plan view, and
wherein when a width of the cutout portion in a second direction crossing the first direction is defined to be W1, and the maximum width of the opening pattern in the second direction is defined to be W2, a relation of W1/W2≥0.4 is established.

6. The semiconductor device according to claim 3,
wherein the semiconductor device has a plurality of the grounding via structures, and
wherein the grounding surface pattern is coupled to the grounding via structures.

7. The semiconductor device according to claim 6, wherein the grounding via structures are arranged to discretely surround the back surface terminal.

8. The semiconductor device according to claim 1, wherein the signal line propagates a signal of a frequency of 80 GHz or higher.

9. The semiconductor device according to claim 1, wherein the thickness of the core layer is 400 μm or less.

10. A semiconductor device comprising:
a semiconductor chip; and
a wiring board coupled to the semiconductor chip, wherein the wiring board includes:
a signal via structure coupled to a signal line; and
a grounding via structure coupled to a ground line,
wherein the wiring board includes:
a first build-up layer equipped with the semiconductor chip;
a core layer positioned in a lower layer of the first build-up layer; and
a second build-up layer positioned in a lower layer of the core layer,
wherein the signal via structure includes:
a surface land formed at a surface of the core layer;
a signal through via coupled to the surface land and penetrating the core layer; and
a back surface terminal electrically coupled to the signal through via and formed at a back surface of the second build-up layer,
wherein the grounding via structure includes:
a grounding surface pattern formed at the surface of the core layer; and
a grounding through via coupled to the grounding surface pattern and penetrating the core layer, and
wherein when in one cross-section parallel to the direction of thickness of the wiring board and obtained by cutting both the signal via structure and the grounding via structure, an angle formed by a line segment coupling a first end of the back surface terminal and a second end of the grounding surface pattern and a vertical line passing the first end is defined to be $\phi$, a relation of cos $\phi \geq 0.89$ is established.

11. The semiconductor device according to claim 10, wherein the signal line propagates a signal of a frequency of 80 GHz or higher.

* * * * *